(12) United States Patent
Yamazaki et al.

(10) Patent No.: US 8,237,248 B2
(45) Date of Patent: Aug. 7, 2012

(54) SEMICONDUCTOR DEVICE

(75) Inventors: Shunpei Yamazaki, Setagaya (JP);
Yoshiaki Oikawa, Tochigi (JP);
Hironobu Shoji, Tochigi (JP); Yutaka Shionoiri, Isehara (JP); Kiyoshi Kato, Atsugi (JP); Masataka Nakada, Kamitsuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 486 days.

(21) Appl. No.: 12/468,284

(22) Filed: May 19, 2009

(65) Prior Publication Data

US 2009/0289341 A1 Nov. 26, 2009

(30) Foreign Application Priority Data

May 23, 2008 (JP) ................................ 2008-136066

(51) Int. Cl.
*H01L 23/552* (2006.01)
(52) U.S. Cl. .................. 257/659; 257/E23.114
(58) Field of Classification Search .................. 257/618, 257/621, 659, 660, E23.001, E23.114
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,677,045 A * | 10/1997 | Nagai et al. | 442/294 |
| 5,679,975 A * | 10/1997 | Wyland et al. | 257/659 |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,100,177 A * | 8/2000 | Noguchi | 438/620 |
| 6,118,502 A | 9/2000 | Yamazaki et al. | |
| 6,224,965 B1 | 5/2001 | Haas et al. | |
| 6,323,550 B1 * | 11/2001 | Martin et al. | 257/704 |
| 6,376,333 B1 | 4/2002 | Yamazaki et al. | |
| 6,403,221 B1 | 6/2002 | Nakamura et al. | |

(Continued)

FOREIGN PATENT DOCUMENTS

EP 0939441 9/1999

(Continued)

OTHER PUBLICATIONS

Invitation to Pay Additional Fees (Application No. PCT/JP2009/059467), International Searching Authority, dated Jun. 16, 2009.

*Primary Examiner* — Ha Tran T Nguyen
*Assistant Examiner* — Kevin Quinto
(74) *Attorney, Agent, or Firm* — Eric J. Robinson; Robinson Intellectual Property Law Office, P.C.

(57) ABSTRACT

An object is to provide a highly reliable semiconductor device having resistance to external stress and electrostatic discharge while achieving reduction in thickness and size. Another object is to prevent defective shapes and deterioration in characteristics due to external stress or electrostatic discharge in a manufacture process to manufacture a semiconductor device with a high yield. A first insulator and a second insulator facing each other, a semiconductor integrated circuit and an antenna provided between the first insulator and the second insulator facing each other, a conductive shield provided on one surface of the first insulator, and a conductive shield provided on one surface of the second insulator are provided. The conductive shield provided on one surface of the first insulator and the conductive shield provided on one surface of the second insulator are electrically connected.

27 Claims, 21 Drawing Sheets

U.S. PATENT DOCUMENTS

| | | |
|---|---|---|
| 6,491,228 B1 | 12/2002 | Ueda et al. |
| 6,762,508 B1 | 7/2004 | Kiso et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |
| 7,487,373 B2 | 2/2009 | Koyama |
| 2003/0032210 A1 | 2/2003 | Takayama et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2006/0011288 A1 | 1/2006 | Watanabe et al. |
| 2006/0267158 A1* | 11/2006 | Weis .................. 257/659 |
| 2007/0004125 A1 | 1/2007 | Watanabe et al. |
| 2007/0044303 A1 | 3/2007 | Yamano |
| 2007/0181875 A1 | 8/2007 | Yamazaki et al. |
| 2007/0259585 A1 | 11/2007 | Yamazaki et al. |
| 2007/0278563 A1 | 12/2007 | Takano et al. |
| 2008/0012126 A1* | 1/2008 | Dozen et al. .................. 257/729 |
| 2008/0036608 A1* | 2/2008 | Sakama ...................... 340/572.7 |
| 2008/0044940 A1 | 2/2008 | Watanabe et al. |
| 2008/0054976 A1 | 3/2008 | Endo et al. |
| 2008/0093464 A1 | 4/2008 | Dairiki et al. |
| 2008/0224941 A1 | 9/2008 | Sugiyama et al. |
| 2008/0303140 A1 | 12/2008 | Ohtani et al. |

FOREIGN PATENT DOCUMENTS

| | | |
|---|---|---|
| EP | 1092739 | 4/2001 |
| EP | 1589797 | 10/2005 |
| EP | 1758438 | 2/2007 |
| EP | 1970951 | 9/2008 |
| JP | 05-190582 | 7/1993 |
| JP | 08-250745 | 9/1996 |
| JP | 08-288522 | 11/1996 |
| JP | 10-092980 | 4/1998 |
| JP | 10-302027 | 11/1998 |
| JP | 2000-231619 | 8/2000 |
| JP | 2001-277726 | 10/2001 |
| JP | 2003-174153 | 6/2003 |
| JP | 2004-118255 | 4/2004 |
| JP | 2004-362341 | 12/2004 |
| JP | 2006-139802 | 6/2006 |
| JP | 2007-241999 | 9/2007 |
| JP | 2008-084303 | 4/2008 |
| WO | WO-96/09158 | 3/1996 |
| WO | WO 01/01740 | 1/2001 |
| WO | WO 2004/001848 | 12/2003 |

* cited by examiner

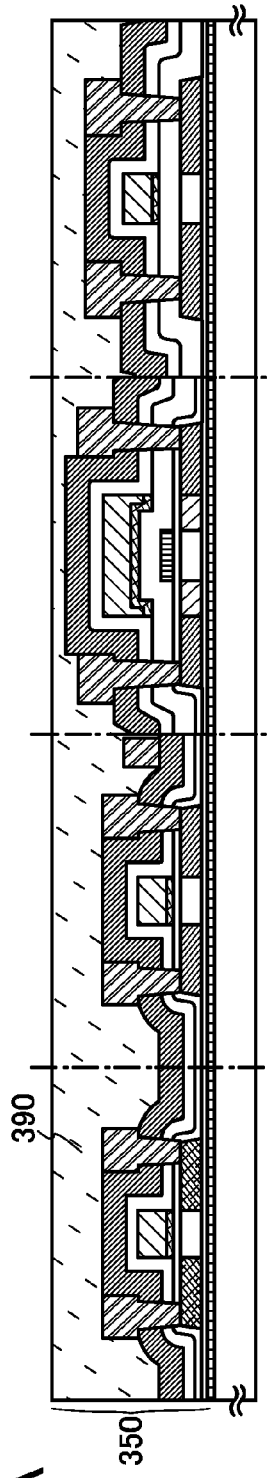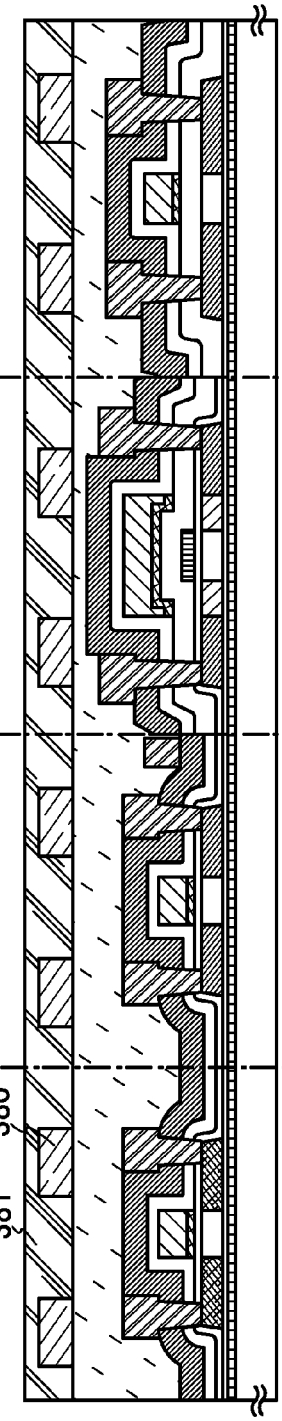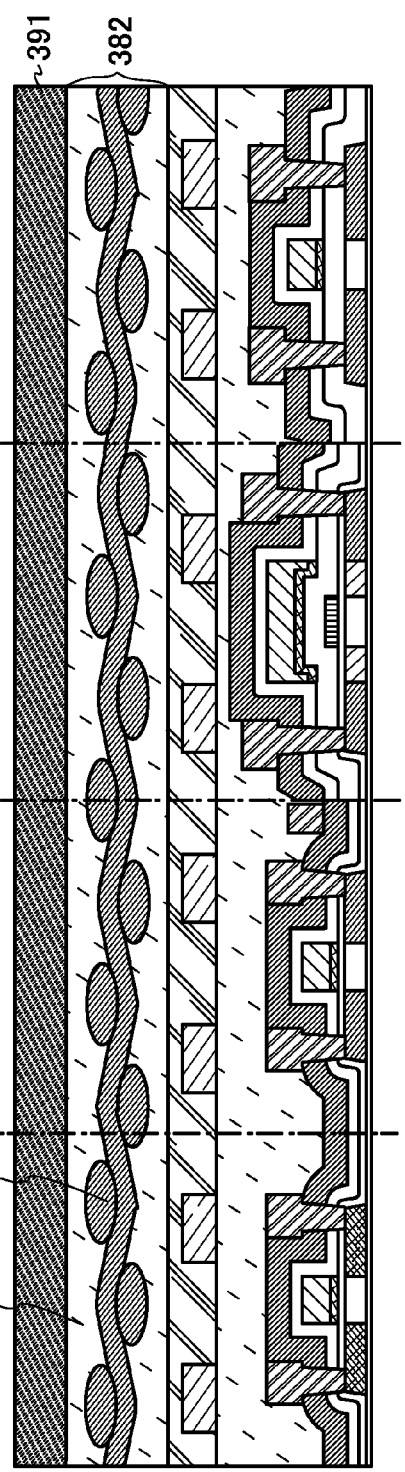

SEMICONDUCTOR DEVICE

TECHNICAL FIELD

The present invention relates to semiconductor devices, and in particular, semiconductor devices which transmit/receive signals to/from the outside without contact.

BACKGROUND ART

Semiconductor devices (such as a non-contact signal processing device or a semiconductor integrated circuit chip) which transmit/receive signals by wireless communication through an antenna have a problem of breakdown (electrostatic breakdown) of the semiconductor device due to electrostatic discharge (ESD). Such a problem is a serious problem which causes reduction in reliability and productivity through a process from a manufacturing step of the semiconductor devices to the use of the semiconductor devices as a product after an inspection step, and its countermeasures are important.

For example, as a countermeasure against electrostatic breakdown, it is proposed to use a conductive polymer layer as for a substrate or an adhesive agent in the semiconductor device (e.g., Reference 1).

REFERENCE

Reference 1: Japanese Published Patent Application No. 2007-241999

DISCLOSURE OF INVENTION

As the market of semiconductor devices has been expanded, requirement of shapes and needed characteristics have been varied. In a case where usage in a variety of situations by expansion of the market is considered, semiconductor devices having higher resistance to electrostatic breakdown and required characteristics are demanded.

Further, in the semiconductor devices whose size and thickness are demanded to be reduced, it is important to increase strength against stress from the outside (hereinafter, referred to as external stress) as well as to reduce the size and the thickness.

It is an object of an embodiment of the present invention to improve resistance to electrostatic breakdown. It is another object of an embodiment of the present invention to improve resistance to external stress as well as resistance to electrostatic breakdown even in the case of reducing the thickness and size of a semiconductor device. It is further another object of an embodiment of the present invention to suppress damage due to external stress or electrostatic discharge in the manufacture process to improve the yield.

An embodiment of the present invention is to provide a semiconductor device including a first insulator, a second insulator, a semiconductor integrated circuit, an antenna, a conductive shield provided on one surface of the first insulator, and a conductive shield provided on one surface of the second insulator. The first insulator and the second insulator are provided to face each other. The semiconductor integrated circuit and the antenna are provided between the first insulator and the second insulator facing each other. The conductive shield provided on one surface of the first insulator and the conductive shield provided on one surface of the second insulator are electrically connected.

The above semiconductor device can be a non-contact signal processing device which has a function of transmitting/receiving signals to/from an external device by wireless communication. The conductive shield indicates a conductive layer having functions of reducing influence of static electricity (such as breakdown of a semiconductor integrated circuit due to static electricity) and transmitting electromagnetic waves transmitted/received by the antenna.

The conductive shield diffuses and releases static electricity applied by electrostatic discharge or prevents local existence (localization) of electric charges (i.e., prevents generation of a local difference in potential on the semiconductor device), so that electrostatic breakdown of the semiconductor integrated circuit can be prevented. The conductive shield is formed so as to overlap with both surfaces of the semiconductor integrated circuit with the first insulator and the second insulator interposed therebetween.

Another embodiment of the present invention is to provide a semiconductor device including a first insulator, a second insulator, a semiconductor integrated circuit, an on-chip antenna, a conductive shield provided on one surface of the first insulator, a conductive shield provided on one surface of the second insulator, and a booster antenna electromagnetically coupled with the on-chip antenna. The first insulator and the second insulator are provided to face each other. The semiconductor integrated circuit and the on-chip antenna are provided between the first insulator and the second insulator facing each other. The conductive shield provided on one surface of the first insulator and the conductive shield provided on one surface of the second insulator are electrically connected.

The conductive shield has conductivity, and a conductive layer which is formed using a conductive material (such as a metal film, a metal oxide film, a metal nitride film, a semiconductor film or a stacked film thereof) can be used.

At least one of the first insulator and the second insulator may have a structure in which a fibrous body is impregnated with an organic resin. In addition, it is preferable that at least one of the first insulator and the second insulator have a thickness of from 5 µm to 50 µm.

In this specification, the term "transfer" (also referred to as transpose) indicates to separate a semiconductor integrated circuit formed over a substrate from the substrate and move the semiconductor integrated circuit to another substrate. In other words, the term "transfer" indicates to move a position where the semiconductor integrated circuit is provided to another substrate.

The insulator may be bonded to the semiconductor integrated circuit with an adhesive layer, and in this case, the adhesive layer is provided between the semiconductor integrated circuit and the insulator. Alternatively, the insulators and the semiconductor integrated circuit may be bonded directly to each other by treatment in which heating and pressure bonding are concurrently performed (hereinafter, referred to as heat and pressure treatment).

Note that in this specification, the term "semiconductor device" indicates general devices which can function using semiconductive properties. A device that has a circuit including a semiconductor element (such as a transistor, a memory element, or a diode), and a semiconductor device such as a chip having a processor circuit can be manufactured with use of the present invention.

According to another embodiment of the present invention, with the conductive shield which covers the semiconductor integrated circuit, electrostatic breakdown (malfunction of the circuit or damage of a semiconductor element) due to electrostatic discharge can be suppressed. According to another embodiment of the present invention, with a pair of insulators sandwiching the semiconductor integrated circuit, a highly reliable semiconductor device having high resistance to external stress while achieving reduction in the thickness and size can be provided. According to another embodiment of the present invention, defective shapes and deterioration in characteristics due to external stress or electrostatic discharge are prevented even in a manufacture process, so that a semiconductor device can be manufactured with a high yield.

BRIEF DESCRIPTION OF DRAWINGS

FIGS. 7A to 7C illustrate a method for manufacturing a semiconductor device.

BEST MODE FOR CARRYING OUT THE INVENTION

Figure 1A:
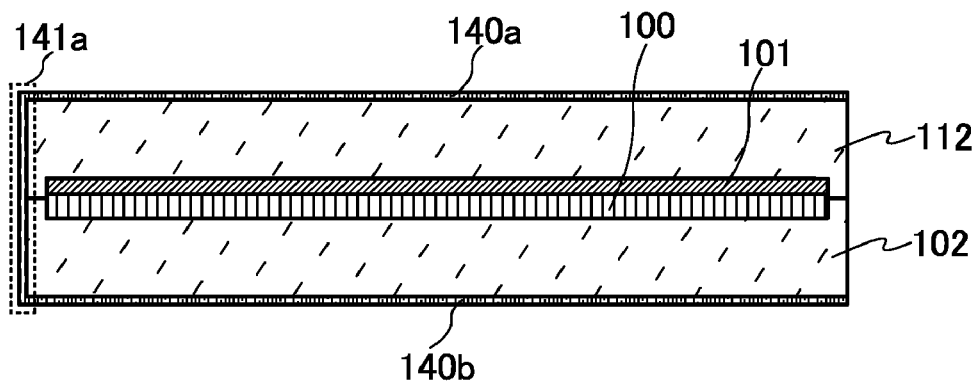
FIGS. 1A to 1C illustrate a semiconductor device.

Embodiments according to the present invention will be hereinafter described with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiment modes described below. Identical portions or portions having similar functions are marked by same reference numerals throughout the drawings so as to omit repeated explanation.

Embodiment 1

In this embodiment, a highly reliable semiconductor device and a method for manufacturing a semiconductor device with a high yield will be described in detail with reference to FIGS. 1A to 1C, FIGS. 2A to 2C, and FIGS. 3A to 3D.

A semiconductor device of this embodiment includes a first insulator 112, a second insulator 102, a semiconductor integrated circuit 100, an antenna 101, a conductive shield 140a, and a conductive shield 140b. The first insulator 112 and the second insulator 102 are provided so as to face each other, the semiconductor integrated circuit 100 and the antenna 101 are provided between the first insulator 112 and the second insulator 102, and the conductive shields 140a and 140b are provided on surfaces (surfaces opposite to surfaces where the semiconductor integrated circuit 100 is provided) of the first insulator 112 and the second insulator 102, respectively. In addition, the conductive shield 140a provided on one surface of the first insulator 112 and the conductive shield 140b provided on one surface of the second insulator 102 are electrically connected (see FIG. 1A).

The conductive shield 140a and the conductive shield 140b may be provided to overlap with the semiconductor integrated circuit 100. For example, as illustrated in FIGS. 1A to 1C, a structure may be employed, in which the conductive shield 140a is provided on an entire surface of the first insulator 112 and the conductive shield 140b is provided on an entire surface of the second insulator 102.

The semiconductor integrated circuit 100 and the antenna 101 are electrically connected to each other, and the semiconductor integrated circuit 100 and the antenna 101 are electrically isolated from each of the conductive shields 140a and 140b.

Figure 1B:
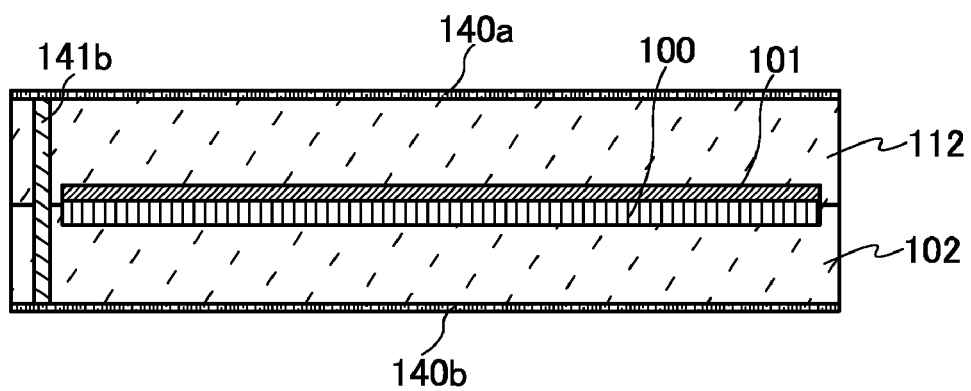
Figure 1C:
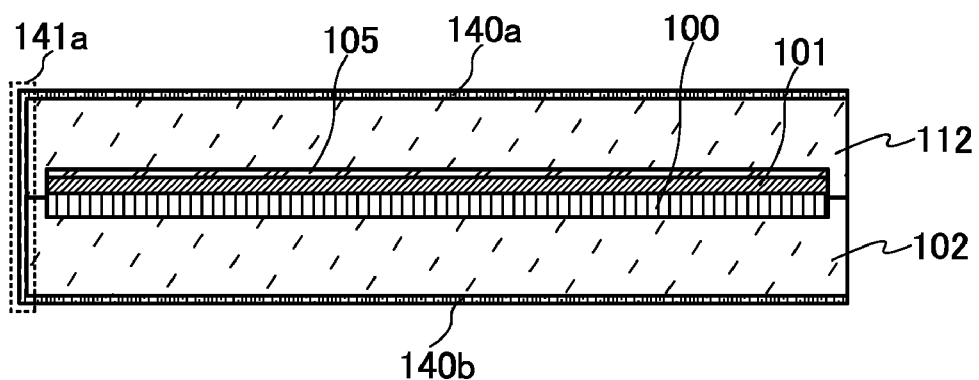

FIGS. 1A to 1C each illustrate a case in which the antenna 101 is provided above the semiconductor integrated circuit 100 so as to overlap with the semiconductor integrated circuit 100, but it is not limited thereto. For example, the antenna 101 may be provided below the semiconductor integrated circuit 100 or may be provided outside the semiconductor integrated circuit 100 (so as not to overlap with the semiconductor integrated circuit 100).

By formation of the conductive shield 140a and the conductive shield 140b, static electricity applied by electrostatic discharge can be diffused and released or local existence (localization) of electric charges (generation of a local difference in potential on the semiconductor device) can be prevented, so that electrostatic breakdown of the semiconductor integrated circuit 100 can be suppressed. Further, by forming the conductive shield on each of surfaces of the first insulator 112 and the second insulator 102 so as to cover the semiconductor integrated circuit 100, a higher effect of preventing electrostatic breakdown can be obtained.

Further, the conductive shield 140a provided on the surface of the first insulator 112 and the conductive shield 140b provided on the surface of the second insulator 102 are electrically connected, whereby diffusion of static electricity and prevention of localization of electric charges can be performed effectively as compared to the case where the conductive shield 140a and the conductive shield 140b are provided without electrical connection or the case where the conductive shield is provided for only one of the first insulator 112 and the second insulator 102. As a result, electrostatic breakdown of the semiconductor integrated circuit 100 can be effectively prevented.

As illustrated in FIG. 1A, a conductor 141a is provided on side surfaces of the first insulator 112 and the second insulator 102, whereby the conductive shield 140a and the conductive shield 140b can be electrically connected. In that case, the conductor 141a can be formed using the same material as a material of the conductive shields 140a and 140b.

Note that it is preferable that the conductor 141a be provided so that at least the conductive shield 140a and the conductive shield 140b can be electrically connected, and the conductor 141a may be partly provided on side surfaces of the first insulator 112 and the second insulator 102. In addition, a position where the conductor 141a is provided may be determined as appropriate. On the side surfaces of the first insulator 112 and the second insulator 102, the conductors 141a may be provided at a plural positions (e.g., in a grid shape), so that the conducive shield 140a and the conductive shield 140b may be electrically connected.

Alternatively, a conductor 141b penetrating through the first insulator 112 and the second insulator 102 is used, whereby the conductive shield 140a provided on the surface of the first insulator 112 and the conductive shield 140b provided on the surface of the second insulator 102 may be electrically connected (see FIG. 1B).

The semiconductor device (having a wireless transmission function) described in this embodiment operates with use of induced electromotive force generated by electromagnetic waves from the outside. Thus, the conductive shields 140a and 140b needs to prevent damage of the semiconductor integrated circuit due to static electricity and needs to be formed using a conductive material transmitting electromagnetic waves.

It is generally known that electromagnetic waves decay in a substance. The decay of electromagnetic waves becomes notable especially in a conductive material. Therefore, in this embodiment, the conductive shields 140a and 140b are formed to be thin enough to be capable of transmitting electromagnetic waves.

The thicknesses of the conductive shields 140a and 140b may be determined based on frequencies of electromagnetic waves to be used for communication and the resistivity or the magnetic permeability of a conductive material to be used as the conductive shields 140a and 140b.

For example, in the case where the frequency of electromagnetic wave is 13.56 MHz and titanium (resistivity ($\rho$): $5.5 \times 10^{-7}$ ($\Omega \cdot m$) is used as the conductive shields 140a and 140b, the thickness of each conductive shield is at least 500 nm or smaller. Accordingly, damage of the semiconductor device due to electrostatic discharge can be suppressed and communication with the outside can be favorably performed.

Alternatively, in the case where indium tin oxide containing silicon oxide (also referred to as "ITSO") is used as the conductive shields 140a and 140b, each conductive shield is preferably formed to a thickness of at least about 700 nm or smaller.

On the other hand, the lower limit of the thicknesses of the conductive shields 140a and 140b is preferably determined based on the resistivity. In the case where the resistivity of a conductive material used for the conductive shields 140a and 140b is high, the conductive shields 140a and 140b are preferably formed thick so that static electricity can effectively diffuse.

In order to efficiently prevent damage of the semiconductor device due to static electricity, the thicknesses of the conductive shields 140a and 140b are preferably set so that the sheet resistance of the conductive shields 140a and 140b is each $1.0 \times 10^7$ $\Omega$/square or lower, preferably $1.0 \times 10^4$ $\Omega$/square or lower, more preferably $1.0 \times 10^2$ $\Omega$/square or lower.

That is, in terms of suppressing electrostatic breakdown, it is preferable that resistivity of the conductive shields 140a and 140b be reduced, and in terms of transmitting electromagnetic waves, it is preferable that the thicknesses of the conductive shields 140a and 140b be reduced. Therefore, as long as sheet resistance of the conductive shields 140a and 140b is within the above range, it is preferable each thickness be set as small as possible.

When titanium or the like, whose the resistivity is low is used as a conductive material, the sheet resistance can be sufficiently decreased and electromagnetic wave can be easily transmitted even in the case of providing the extremely thin conductive shield. However, when a manufacture process and the like are taken into consideration, the conductive shields 140a and 140b are preferably formed to a thickness of at least about 1 nm or larger (preferably 3 nm or larger). Alternatively, when indium tin oxide containing silicon oxide or the like, whose resistivity is relatively high is used, each conductive shield is preferably formed to a thickness of about at least 5 nm or more.

In accordance with the above, a material used for the conductive shields 140a and 140b and the thickness thereof are controlled in consideration of suppression of electrostatic breakdown and transmission of electromagnetic waves. Accordingly, damage of a semiconductor device due to electrostatic discharge can be efficiently suppressed, and a semiconductor device which can communicate with the outside favorably can be obtained.

Next, materials and the like which can be applied to the structures illustrated in FIGS. 1A to 1C are described in detail.

The conductive shields 140a and 140b can be formed using a conductive layer. The conductive layer is formed with a film of metal, metal nitride, metal oxide, or the like, which is other than the above described such as titanium or indium tin oxide containing silicon oxide; or a stack of any of the films.

The conductive shields 140a and 140b may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, or barium, or an alloy material, a compound material, a nitride material, or an oxide material containing the above element as its main component.

As the nitride material, tantalum nitride, titanium nitride, or the like can be used.

As the oxide material, indium tin oxide (ITO), organic indium, organic tin, zinc oxide, or the like can be used, in addition to indium tin oxide containing silicon oxide. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film formed of a semiconductor doped with an impurity element or the like to have conductivity, or the like can be used as the conductive shields 140a and 140b. For example, a polycrystalline silicon film doped with an impurity element such as phosphorus, or the like can be used.

Further alternatively, a conductive polymer may be used as the conductive shields 140a and 140b. As the conductive polymer, a so-called π-electron conjugated conductive polymer can be used. For example, polyaniline and/or a derivative thereof, polypyrrole and/or a derivative thereof, polythiophene and/or a derivative thereof, a copolymer of two or more kinds of those materials, and the like can be given.

Specific examples of a conjugated conductive polymer are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4- carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

The conductive shields 140a and 140b containing conductive polymer may have an organic resin or a dopant (a halogen, a Lewis acid, an inorganic acid, an organic acid, a halide of a transition metal, an organic cyano compound, and a nonionic surfactant or the like).

The above conductive shields 140a and 140b can be formed by a dry process such as a sputtering method, a plasma CVD method, or an evaporation method or a wet process such as a coating method, a printing method, or a droplet discharge method (an ink jet method).

Further, the conductive shields 140a and 140b are formed from a film having a light-blocking property, such as a titanium film, a molybdenum film, or a tungsten film, whereby the semiconductor integrated circuit 100 can be a black box.

In addition, a protective layer may be formed over the semiconductor integrated circuit 100 and the antenna 101. For example, in a structure of FIG. 1A, an inorganic insulating layer 105 can be formed as a protective layer above the semiconductor integrated circuit 100. FIG. 1C illustrates an example in which the antenna 101 is formed over the semiconductor integrated circuit 100 and the inorganic insulating layer 105 is formed over the antenna 101. The antenna 101 is covered with the inorganic insulating layer 105, whereby oxidation of the conductive layer functioning as the antenna can be prevented.

The inorganic insulating layer 105 can be formed using an inorganic compound by a sputtering method, a plasma CVD method, a coating method, a printing method, or the like, with a single layer or a stacked layer. As a typical example of the inorganic compound, oxidized silicon or nitrided silicon is given. Further, as a typical example of the oxidized silicon and nitrided silicon, silicon oxide, silicon oxynitride, silicon nitride, silicon nitride oxide, and the like are given. Note that in this specification, a silicon oxynitride film means a film that contains a larger amount of oxygen than nitrogen; specifically, it contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains a larger amount of nitrogen than oxygen and, in the case where measurements are performed using RBS and HFS, contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The inorganic insulating layer 105 may have a layered structure. For example, a layered structure may be formed using an inorganic compound. Typically, the inorganic insulating layer 105 can be formed by stacking silicon oxide, silicon nitride oxide, and silicon oxynitride.

Further, a protective layer may be stacked on each of the conductive shields 140a and 140b. The protective layer may be formed by a CVD method, a sputtering method, or the like. Alternatively, the protective layer can be formed by performing surface treatment such as plasma treatment on the conductive shields 140a and 140b. For example, titanium films (with each thickness of from 10 nm to 50 nm) are formed as the conductive shields 140a and 140b and titanium oxide films are formed as the protective layer on the titanium films. Titanium oxide can be formed by performing plasma treatment or the like with respect to titanium.

The protective layer formed on each of the conductive shields 140a and 140b is an outermost surface, whereby deterioration of the conductive shields 140a and 140b can be prevented. The protective layer may have a thickness from 10 nm to 200 nm.

Figure 2A:
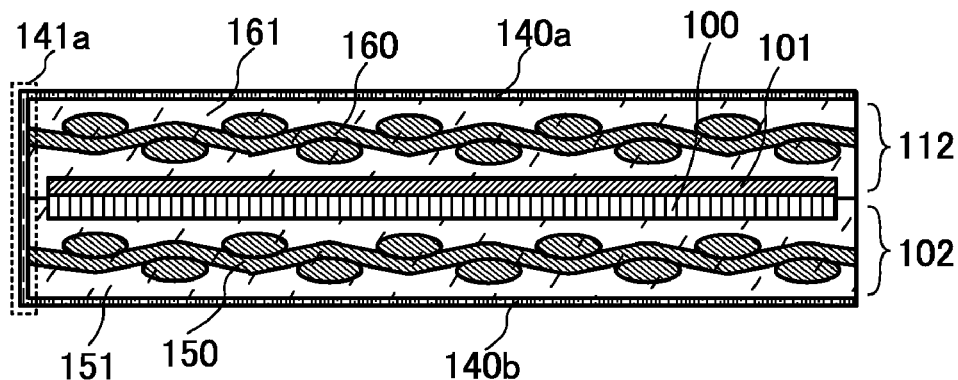
FIGS. 2A to 2C illustrate a semiconductor device.
Figure 2B:
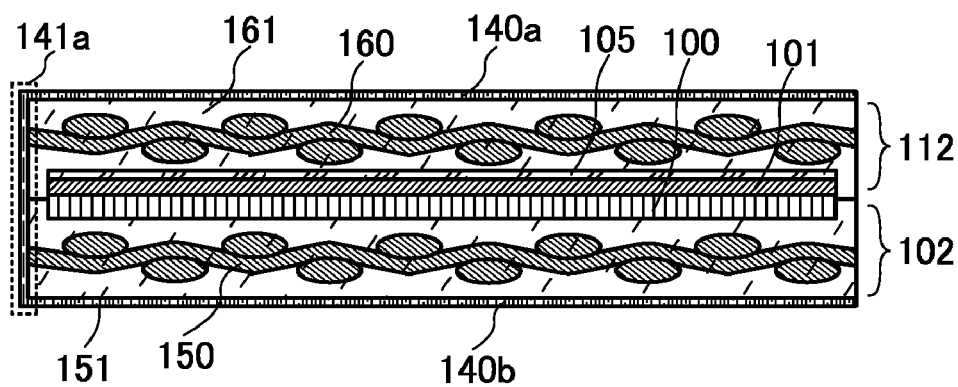
Figure 2C:
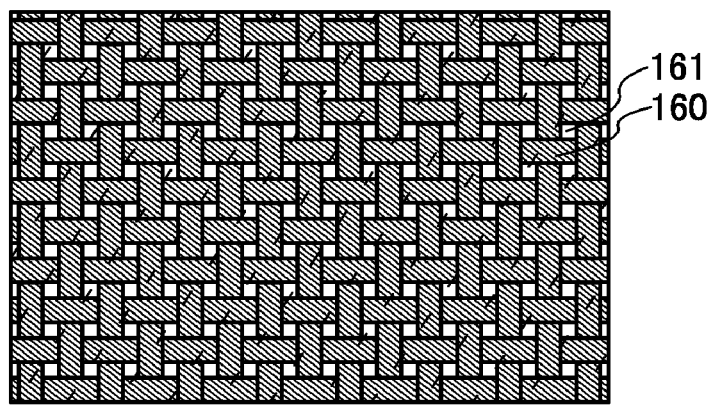

As the first insulator 112 and the second insulator 102, a structure body in which a fibrous body is impregnated with an organic resin may be used. FIGS. 2A to 2C illustrate examples in which a structure body in which a fibrous body is impregnated with an organic resin is used as the first insulator 112 and the second insulator 102. Note that FIG. 2A corresponds to FIG. 1A, and FIG. 2B corresponds to FIG. 1C.

FIGS. 2A and 2B each illustrate a case where a structure body in which a fibrous body 160 is impregnated with an organic resin 161 is used as the first insulator 112 and a structure body in which a fibrous body 150 is impregnated with an organic resin 151 is used as the second insulator 102.

As the fibrous body 150 and the fibrous body 160, a woven fabric or a nonwoven fabric which uses high-strength fiber of an organic compound or an inorganic compound can be used. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As a glass fiber, a glass fiber using E glass, S glass, D glass, Q glass, or the like can be given. Note that the fibrous body 150 and the fibrous body 160 may be formed from one kind of the above-described high-strength fibers or a plurality of the above-described high-strength fibers.

The fibrous body 150 and the fibrous body 160 can be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. In such a manner, use of a yarn bundle having an elliptical shape or a flat shape in cross section in this manner can make each thickness of the fibrous body 150 and the fibrous body 160 small.

FIG. 2C is a plan view of a woven fabric which is woven using yarn bundles for warp yarns and weft yarns. In FIG. 2C, the fibrous body 160 is woven using warp yarns spaced at regular intervals and weft yarns spaced at regular intervals. Such a fibrous body which is woven using the warp yarns and the weft yarns has regions without the warp yarns and the weft yarns. Such a region is impregnated with the organic resin 161.

As illustrated in FIG. 2C, the fibrous body is woven to be a fabric form by crossing fibers, and the woven fibrous body is impregnated with an organic resin, so that expansion and contraction in the surface direction of the fabric is prevented by the fibrous body in a fabric form and a structure body having flexibility in the perpendicular direction can be obtained.

In the drawings of this embodiment, the fibrous bodies 150 and 160 are illustrated as a woven fabric which is plain-woven using yarn bundles having an elliptical shape in cross section.

Note that a structure body in which a fibrous body is impregnated with an organic resin is also referred to as a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured.

In the case of using a structure body in which a fibrous body is impregnated with an organic resin is used as the first insulator 112 and the second insulator 102, the thickness of the structure body is preferably from 10 μm to 100 μm, further preferably from 10 μm to 30 μm. When a structure body with such a thickness is used, a thin semiconductor device capable of being curved can be manufactured. For example, as the first insulator 112 and the second insulator 102, a structure body with a modulus of elasticity of from 13 GPa to 15 GPa and a modulus of rapture of 140 MPa or higher and lower than 300 MPa.

Note that a plurality of structure body in which the fibrous body is impregnated with the organic resin may be stacked. In this case, the structure body may be formed by stacking a plurality of structure bodies in each of which a fibrous body with a single layer is impregnated with an organic resin or impregnating a plurality of fibrous bodies which are stacked with an organic resin. In stacking a plurality of structure bodies in each of which a fibrous body with a single layer is impregnated with an organic resin, another layer may be interposed between the structure bodies.

A thermosetting resin such as an epoxy resin, an unsaturated polyester resin, a polyimide resin, a bismaleimide-triazine resin, or a cyanate resin can be used for the organic resin 151 and the organic resin 161. Alternatively, a thermoplastic resin such as a polyphenylene oxide resin, a polyetherimide resin, or a fluorine resin can be used for the organic resin 151 and the organic resin 161. With use of such organic resins, the structure bodies in each of which a fibrous body is impregnated with an organic resin can be bonded to the semiconductor integrated circuit by thermal treatment. The higher the glass transition temperature of the organic resins 151 and 161 is, the less the organic resins 151 and 161 are broken by local pressing force, which is preferable.

Highly thermally-conductive filler may be dispersed in the organic resins 151 and 161 or the yarn bundles of fibers. As the highly thermally-conductive filler, aluminum nitride, boron nitride, silicon nitride, alumina, or the like can be given. As the highly thermally-conductive filler, a metal particle such as silver or copper can also be given. When the highly thermally-conductive filler is included in the organic resin or the yarn bundles of fibers, heat generated in the semiconductor integrated circuit can be easily released to the outside. Accordingly, thermal storage in the semiconductor device can be suppressed, and breakdown of the semiconductor device can be reduced.

Further, in order to enhance permeability of an organic resin into the inside of the yarn bundle of fibers, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

In the case of using a structure body in which a fibrous body is impregnated with an organic resin as the first insulator 112 and the second insulator 102, it is preferable to use the organic resin which is cured. However, this embodiment is not limited thereto, but an organic resin which is semi-cured may be used as the first insulator 112 and the second insulator 102.

Alternatively, as the first insulator 112 and the second insulator 102, a material having the low modulus of elasticity and the high breaking strength may be used. For example, a film having rubber elasticity whose modulus of elasticity is from 5 GPa to 12 GPa and modulus of rupture is 300 MPa or higher may be used for the first insulator 112 and the second insulator 102.

In this case, it is preferable to use a high-strength material as the first insulator 112 and the second insulator 102. As typical examples of the high-strength material, the following can be given: a polyvinyl alcohol resin, a polyester resin, a polyamide resin, a polyethylene resin, an aramid resin, a polyparaphenylene benzobisoxazole resin, a glass resin, and the like. When the first insulator 112 and the second insulator 102 are formed using a high-strength material having elasticity and provided, a load such as local pressing force applied from the outside is diffused through the whole of a layer and absorbed, so that damage of the semiconductor device can be prevented.

More specifically, as the first insulator 112 and the second insulator 102, the following can be used: an aramid resin, a polyethylene naphthalate (PEN) resin, a polyether sulfone (PES) resin, a polyphenylene sulfide (PPS) resin, a polyimide (PI) resin, or the like.

An adhesive layer may be used for bonding the first insulator 112 and the second insulator 102 to the semiconductor integrated circuit 100. It is preferable that the adhesive layer make the insulator and the semiconductor integrated circuit be bonded to each other, and a thermosetting resin, an ultraviolet cured resin, an acrylic resin, an urethane resin, an epoxy resin, a silicone resin, or the like can be used therefor. The adhesive layer may be formed to a thickness of from 3 μm to 15 μm. In a case where the first insulator 112, and the second insulator 102 to the semiconductor integrated circuit 100 are bonded by heat and pressure treatment, the adhesive layer is not necessarily used.

Next, an example of a method for manufacturing a semiconductor device shown in this embodiment is described with reference to FIGS. 3A to 3D.

Figure 3A:
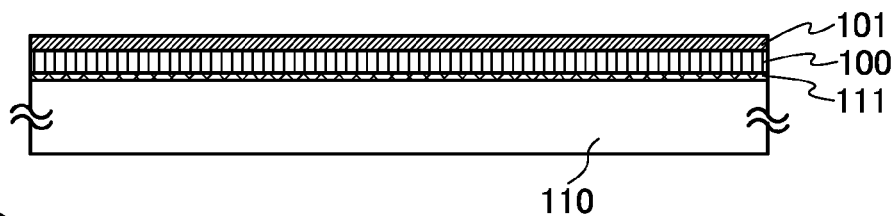
FIGS. 3A to 3D illustrate a method for manufacturing a semiconductor device.
Figure 3B:
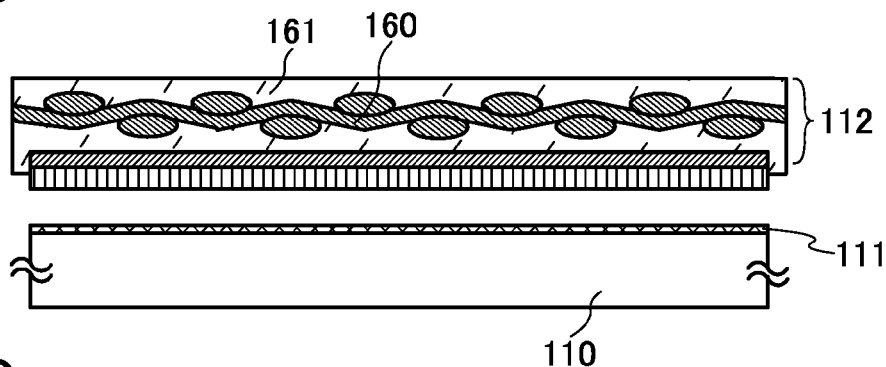

First, the semiconductor integrated circuit 100 and the antenna 101 are formed over a substrate 110 having an insulating surface with a separation layer 111 interposed therebetween (see FIG. 3A).

As the substrate 110, a glass substrate, a quartz substrate, a sapphire substrate, a ceramic substrate, a metal substrate having an insulating layer formed on its surface, or the like can be used. Alternatively, a plastic substrate which can withstand the processing temperature of this embodiment may be used. In a manufacture process of the semiconductor device, the substrate can be selected as appropriate depending on a step to be performed.

The separation layer 111 is formed by a sputtering method, a plasma CVD method, a coating method, a printing method, or the like, with a single layer or a stacked layer, using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) or silicon (Si); or an alloy material or a compound material containing any of the elements as its main component. A crystalline structure of a layer containing silicon may be any one of an amorphous structure, a microcrystalline structure, or a polycrystalline structure. Note that a coating method here includes a spin-coating method, a droplet discharge method, and a dispensing method in its category.

In the case where the separation layer 111 has a single layer structure, it is preferable to form a tungsten layer, a molybdenum layer, or a layer containing a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum may be formed. Note that the mixture of tungsten and molybdenum corresponds, for example, to an alloy of tungsten and molybdenum.

In the case where the separation layer 111 has a stacked-layer structure, a tungsten layer, a molybdenum layer, or a layer containing a mixture of tungsten and molybdenum is preferably formed as a first layer. Oxide of tungsten, molybdenum, or a mixture of tungsten and molybdenum; nitride of tungsten, molybdenum, or a mixture of tungsten and molybdenum; oxynitride of tungsten, molybdenum, or a mixture of tungsten and molybdenum; or nitride oxide of tungsten, molybdenum, or a mixture of tungsten and molybdenum is preferably formed as a second layer.

In the case where the separation layer 111 has a layered structure of a layer containing tungsten and a layer containing tungsten oxide, the layer containing tungsten may be formed first and an insulating layer formed of oxide may be formed on the layer containing tungsten so that a layer containing tungsten oxide can be formed at an interface between the tungsten layer and the insulating layer. Further, the surface of the tungsten layer may be subjected to thermal oxidation treatment, oxygen plasma treatment, or treatment using a strong oxidizing solution such as ozone water to form a layer containing an oxide of tungsten. Plasma treatment or heat treatment may be performed in an atmosphere of an elementary substance of oxygen, nitrogen, dinitrogen monoxide, or dinitrogen monoxide, or a mixed gas of the gas and another gas. The same applies to the case of forming a layer containing nitride, oxynitride and nitride oxide of tungsten. After a layer containing tungsten is formed, a silicon nitride layer, a silicon oxynitride layer and a silicon nitride oxide layer may be formed thereover.

Note that, although the separation layer 111 is formed so as to be in contact with the substrate 110 according to the above step, this embodiment is not limited to the above step. An insulating layer which serves as a base may be formed so as to be in contact with the substrate 110, and the separation layer 111 may be provided so as to be in contact with the insulating layer.

Next, the first insulator 112 is bonded to the antenna 101 provided over the semiconductor integrated circuit 100, and the semiconductor integrated circuit 100 is separated from the substrate 110 by using the separation layer 111. As a result, the semiconductor integrated circuit 100 is provided on the first insulator 112 side (see FIG. 3B).

In this embodiment, the structure body in which the fibrous body 160 is impregnated with the organic resin 161 is used as the first insulator 112. A structure body is heated and subjected to pressure bonding so that the organic resin of the structure body is plasticized or cured. In the case where the organic resin is an organic plastic resin, the organic resin which is plasticized is then cured by being cooled to room temperature. By performing heating and pressure bonding, the organic resin 161 is uniformly spread so as to be in close contact with the antenna 101 and is cured. A step in which the structure body is subjected to pressure bonding is performed under an atmospheric pressure or a reduced pressure.

Note that for a step of transferring to another substrate, the following method can be used as appropriate: a method in which a separation layer is formed between a substrate and a semiconductor integrated circuit, a metal oxide film is provided between the separation layer and the semiconductor integrated circuit, and the metal oxide film is crystallized to be embrittled, whereby a semiconductor element layer is separated; a method in which an amorphous silicon film containing hydrogen is formed between a substrate with high heat resistance and a semiconductor integrated circuit, and the amorphous silicon film is removed by laser light irradiation or etching, whereby the semiconductor integrated circuit is separated; a method in which a separation layer is formed between a substrate and a semiconductor integrated circuit, a metal oxide film is provided between the separation layer and the semiconductor integrated circuit, the metal oxide film is crystallized to be embrittled, part of the separation layer is removed by etching using a solution or a fluoride halogen gas such as $NF_3$, $BrF_3$, or $ClF_3$, and then the semiconductor integrated circuit is separated at the embrittled metal oxide film; a method in which a substrate over which a semiconductor integrated circuit is formed is mechanically removed or is removed by etching using a solution or a fluoride halogen gas such as $NF_3$, $BrF_3$, or $ClF_3$; or the like. Alternatively, a method may be used in which a film containing nitrogen, oxygen, hydrogen, or the like (e.g., an amorphous silicon film containing hydrogen, a hydrogen-containing alloy film, or an alloy film containing oxygen) is used as a separation layer, the separation layer is irradiated with laser light so that nitrogen, oxygen, or hydrogen contained in the separation layer is discharged as a gas, whereby separation of a semiconductor integrated circuit from a substrate is promoted.

The above separation methods are combined, whereby the transfer step can be performed more easily. That is, the separation can also be performed with physical force (by a machine or the like) after performing laser light irradiation; etching to the separation layer with a gas, a solution, or the like; or mechanical removal with a sharp knife, scalpel, or the like; so as to make a condition where the separation layer and the element formation layer can be easily separated from each other.

Alternatively, a liquid is made to penetrate the interface between the separation layer 111 and the semiconductor integrated circuit 100, and then the semiconductor integrated circuit 100 may be separated from the substrate 110.

Figure 3C:
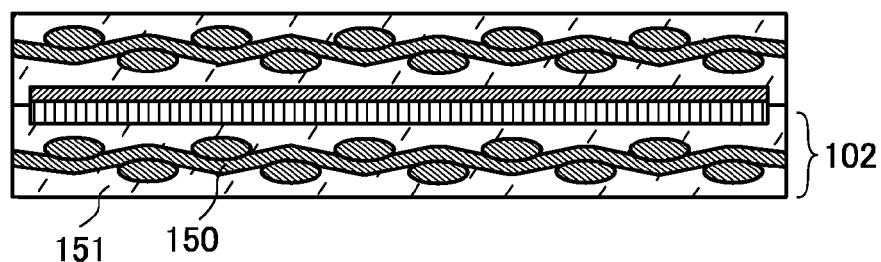

Next, the second insulator 102 is formed on an exposed separation surface of the semiconductor integrated circuit 100, so that the antenna 101 and the semiconductor integrated circuit 100 are provided between the first insulator 112 and the second insulator 102 (see FIG. 3C).

A structure body in which the fibrous body 150 is impregnated with the organic resin 151 can be used, as in the case of the first insulator 112. In this case, the structure body of the second insulator 102 may be heated and subjected to pressure bonding and then bonded to the exposed separation surface of the semiconductor integrated circuit 100.

Figure 3D:
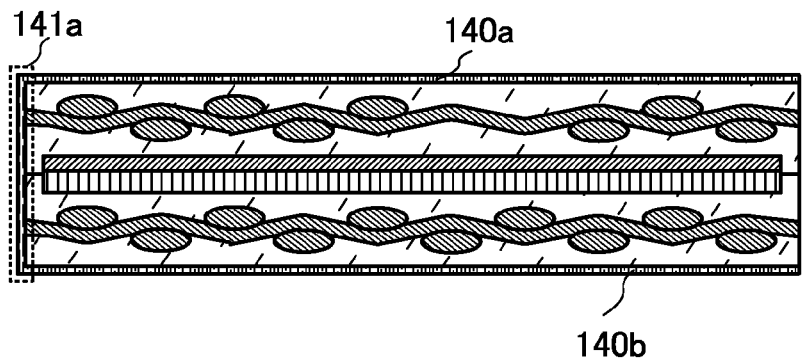

Next, the conductive shield 140a is formed on a surface of the first insulator 112, the conductive shield 140b is formed on a surface of the second insulator 102, and the conductive shield 140a and the conductive shield 140b are electrically connected to each other (see FIG. 3D). In this embodiment, as the conductive shields 140a and 140b, a titanium film is formed by a sputtering method to a thickness of 10 nm. Electrical connection between the conductive shield 140a and the conductive shield 140b can be obtained by forming a titanium film as the conductor 141a by a sputtering method on a side surface of the first insulator 112 and a side surface of the second insulator 102.

Note that after the conductive shield 140a is formed on the surface of the first insulator 112 and the conductive shield 140b is formed on the surface of the second insulator 102, a conductor is made to penetrate through the first insulator 112 and the second insulator 102, so that the conductive shield 140a and the conductive shield 140b may be electrically connected. For example, the conductor 141a is formed by making a conductor with a needle-like shape penetrate through the first insulator 112 and the second insulator 102, so that the conductive shield 140a and the conductive shield 140b can be electrically connected. Alternatively, an opening is formed in the first insulator 112 and the second insulator 102 by irradiation with laser light, and the conductor 141a is provided in the opening, so that the conductive shield 140a and the conductive shield 140b are electrically connected.

In the practical manufacture process, a plurality of semiconductor integrated circuits which are apart from each other and a plurality of antennas which are apart from each other are sandwiched between the first insulator 112 and the second insulator 102. After the semiconductor integrated circuits are cut off into individual semiconductor integrated circuits, the conductive shields 140a and 140b are formed, so that a semiconductor integrated circuit chip can be obtained. There is no particular limitation on a cutoff means as long as the semiconductor integrated circuits can be cut off physically, and in this embodiment, the semiconductor integrated circuits are cut off by laser irradiation. Cutoff between a plurality of the semiconductor integrated circuits makes a structure in which the antenna 101 and the semiconductor integrated circuit 100 are sealed with the first insulator 112 and the second insulator 102.

As described in this embodiment, by formation of the conductive shields so as to cover the semiconductor integrated circuit, electrostatic breakdown (such as malfunction of the circuit and damage of the semiconductor element) of the semiconductor integrated circuit due to electrostatic discharge can be prevented. Further, with a pair of insulators sandwiching the semiconductor integrated circuit, highly reliable semiconductor device having high resistance while achieving reduction in thickness and size can be provided. Furthermore, defective shapes and deterioration in characteristics due to external stress or electrostatic discharge are prevented even in a manufacture process, so that a semiconductor device can be manufactured with a high yield.

Embodiment 2

In this embodiment, another example of a semiconductor device which is different from that of the above embodiment will be described with reference to FIGS. 14A and 14B, FIGS. 15A and 15B, and FIGS. 16A to 16D. Note that the same portions or portions having a similar function as those of Embodiment 1 are denoted by the same reference numeral through different drawings in a structure of this embodiment to be described hereinafter, and repetitive description thereof is omitted.

In this embodiment, an example in which an insulator has a layered stricture is described. A semiconductor device illustrated in FIG. 14A includes the semiconductor integrated circuit 100 and the antenna 101 which are sandwiched between the first insulator 112 and the second insulator 102, a third insulator 103 provided between the semiconductor integrated circuit 100 and the second insulator 102, the conductive shield 140a provided on an outer surface of the first insulator 112, and the conductive shield 140b provided on an outer surface of the second insulator 102.

The conductive shield 140a and the conductive shield 140b are electrically connected. Electrical connection between the conductive shield 140a and the conductive shield 140b can be obtained by forming the conductor 141a on side surfaces of the first insulator 112 and the second insulator 102. Alternatively, with use of a conductor penetrating through the first insulator 112 and the second insulator 102, the conductive shield 140a and the conductive shield 140b may be electrically connected.

Figure 14A:
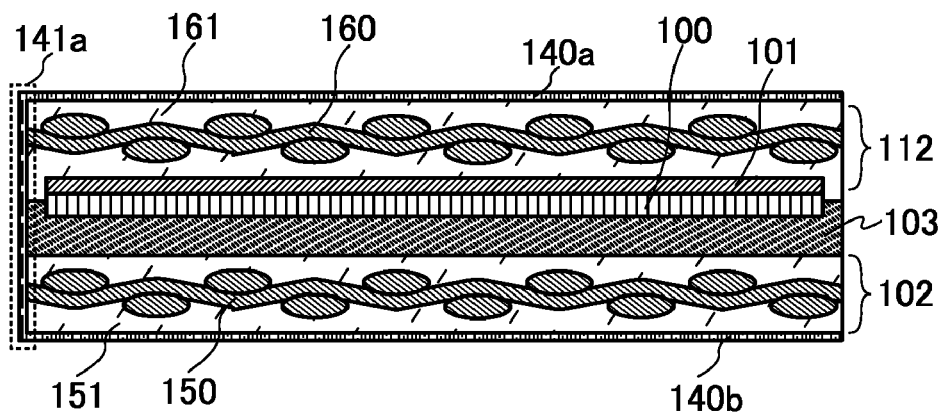
FIGS. 14A and 14B illustrate a semiconductor device.
Figure 14B:
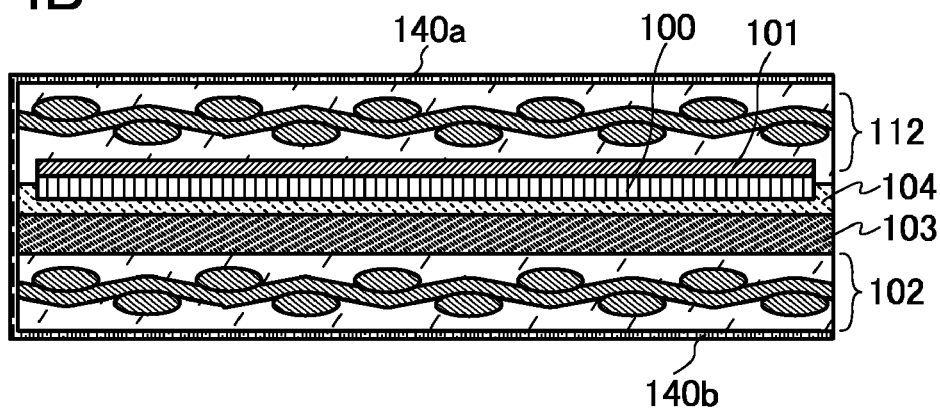

A semiconductor device illustrated in FIG. 14B has a structure in which the semiconductor integrated circuit 100 and the third insulator 103 are bonded by using an adhesive layer 104. An acrylic resin can be used for the adhesive layer 104.

The third insulator 103 provided between the semiconductor integrated circuit 100 and the second insulator 102 can function as an impact diffusion layer for protecting the semiconductor integrated circuit 100 against external stress. Thus, it is preferable that the third insulator 103 have a lower modulus of elasticity and higher breaking strength than the first insulator 112 and the second insulator 102. For example, a film having rubber elasticity whose modulus of elasticity is from 5 GPa to 12 GPa and modulus of rupture is 300 MPa or higher may be used for the third insulator 103.

Further, when the third insulator 103 is provided in the vicinity of (preferably, in contact with) the semiconductor integrated circuit 100, the force applied from the outside to the semiconductor integrated circuit 100 is diffused effectively, so that damage of the semiconductor integrated circuit 100 can be reduced.

The third insulator 103 is preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. When the third insulator 103 is formed from a high-strength material with elasticity and provided, a load such as local pressing force is diffused through the whole of a layer and absorbed, so that damage of the semiconductor device can be prevented.

More specifically, as the third insulator 103, an aramid resin, a polyethylene naphthalate (PEN) resin, a polyether sulfone (PES) resin, a polyphenylene sulfide (PPS) resin, a polyimide (PI) resin, or the like can be given. In this embodiment, an aramid resin film (with a modulus of elasticity of 10 GPa and a breaking strength of 480 MPa) is used as the third insulator 103.

As each of the first insulator 112 and the second insulator 102 in FIGS. 14A and 14B, a structure body in which a fibrous body is impregnated with an organic resin can be used. Each of the first insulator 112 and the second insulator 102 in FIGS. 14A and 14B preferably has a modulus of elasticity of 13 GPa or higher and a modulus of rupture of lower than 300 MPa.

Figure 15A:
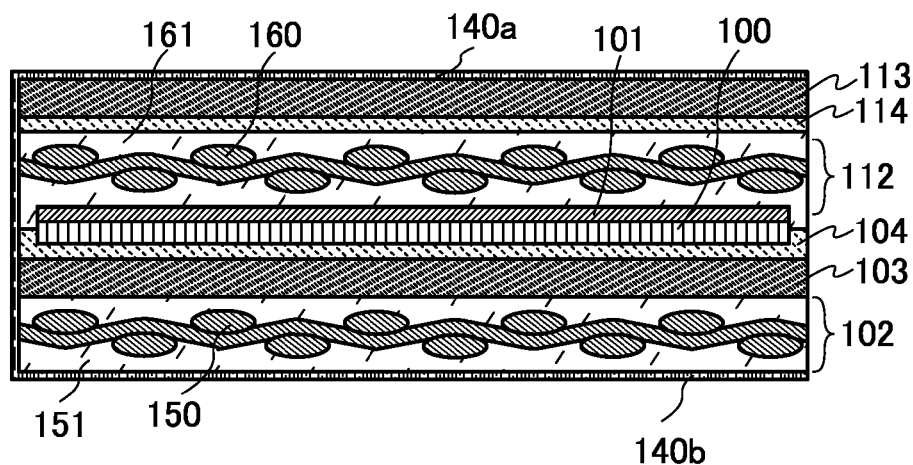
FIGS. 15A and 15B illustrate a semiconductor device.
Figure 15B:
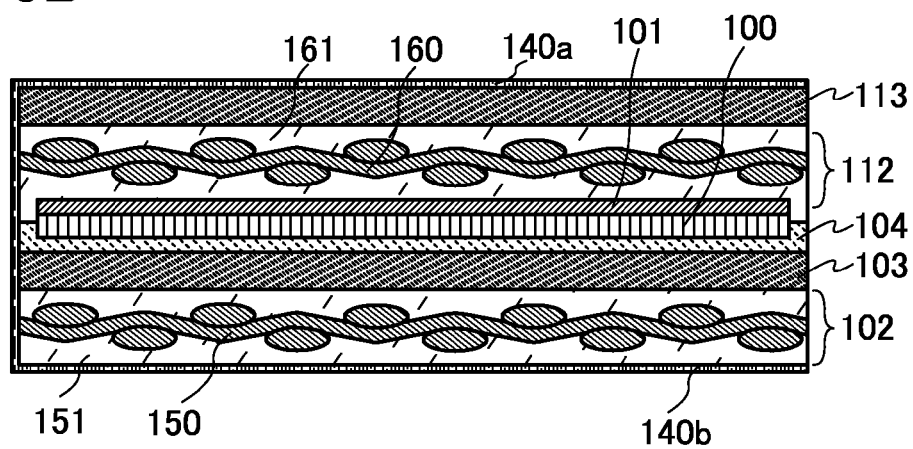

Further, as illustrated in FIGS. 15A and 15B, a fourth insulator 113 similar to the third insulator 103 may be provided on an outer surface (a surface on the side opposite to the side of a surface in contact with the antenna 101) of the first insulator 112.

FIG. 15A illustrates an example in which the fourth insulator 113 is bonded to the outer surface of the first insulator 112 with the adhesive layer 114. As for the fourth insulator 113, the material similar to that of the third insulator 103 described above can be used.

In this embodiment, an aramid film is used as the fourth insulator 113 and an acrylic resin can be used for the adhesive layer 114. In a case where the first insulator 112 and the fourth insulator 113 are bonded to each other by heat and pressure treatment, the adhesive layer 114 is not necessarily used. In this case, the antenna 101, the first insulator 112, and the fourth insulator 113 can be bonded directly as illustrated in FIG. 15B. The bonding step of the antenna 101 and the first insulator 112 and the bonding step of the first insulator 112 and the fourth insulator 113 may be performed concurrently or performed separately.

Next, a manufacturing method of the semiconductor device of this embodiment is described with reference to FIGS. 16A to 16D.

Figure 16A:
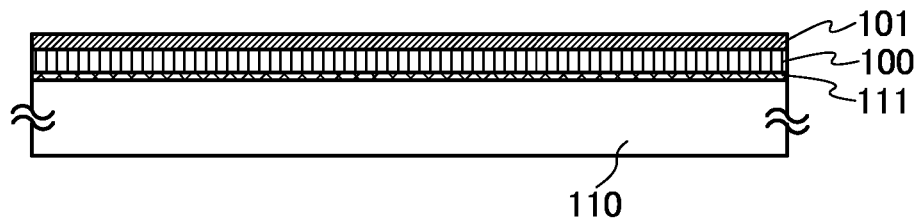
FIGS. 16A to 16D illustrate a method for manufacturing a semiconductor device.
Figure 16B:
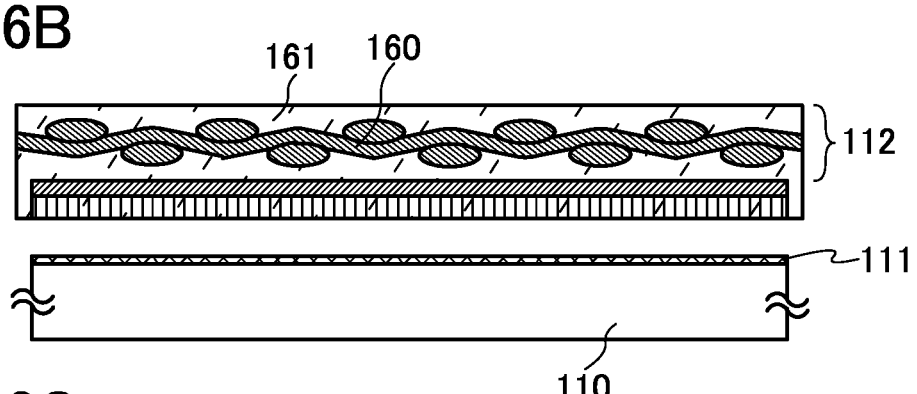

First, the semiconductor integrated circuit 100 and the antenna 101 are formed over the substrate 110 having an insulating surface with the separation layer 111 interposed therebetween (see FIG. 16A).

The first insulator 112 and the antenna 101 provided over the semiconductor integrated circuit 100 are bonded, and the semiconductor integrated circuit 100 is separated from the substrate 110 by using the separation layer 111. As a result, the semiconductor integrated circuit 100 is provided on the first insulator 112 side (see FIG. 16B).

As the first insulator 112, a structure body in which the fibrous body 160 is impregnated with the organic resin 161 is used. The structure body is heated and subjected to pressure bonding so that the organic resin of the structure body is plasticized or cured. In the case where the organic resin is an organic plastic resin, the organic resin which is plasticized is then cured by cooling to room temperature.

Figure 16C:
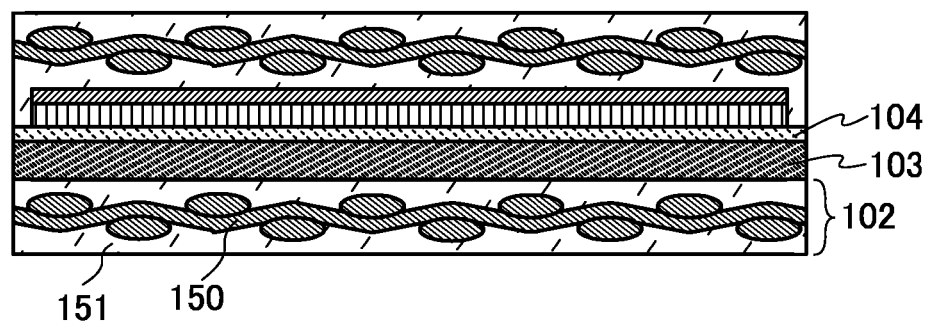

Next, the third insulator 103 is bonded to an exposed separation surface of the semiconductor integrated circuit 100 with the adhesive layer 104 interposed therebetween, and then, the second insulator 102 is bonded to the third insulator 103 (see FIG. 16C).

The third insulator 103 on which the adhesive layer 104 is formed in advance may be bonded to the semiconductor integrated circuit 100. Alternatively, after the adhesive layer 104 is formed on the semiconductor integrated circuit 100, the third insulator 103 may be bonded to the adhesive layer 104.

As the second insulator 102, a structure body in which the fibrous body 150 is impregnated with the organic resin 151 may be used.

Figure 16D:
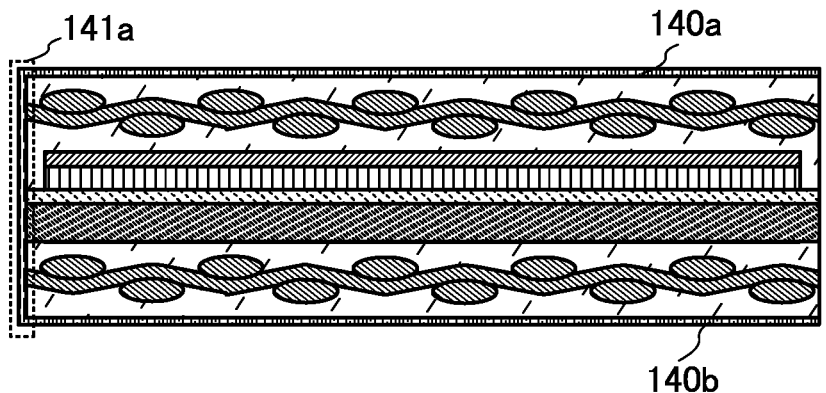

Next, the conductive shield 140a is formed on the surface of the first insulator 112, the conductive shield 140b is formed on the surface of the second insulator 102, and the conductive shield 140a and the conductive shield 140b are electrically connected (see FIG. 16D).

In this embodiment, as each of the conductive shields 140a and 140b, a titanium film is formed by a sputtering method to a thickness of 10 nm (preferably, from 3 nm to 30 nm). The conductive shield 140a and the conductive shield 140b are electrically connected through the conductor 141a, which can be performed by, for example, forming a titanium film by a sputtering method on side surfaces of the first insulator 112 and the second insulator 102.

With the third insulator 103 and the fourth insulator 113, strength of the semiconductor device against external stress can be increased. Further, by formation of the third insulator 103 between the semiconductor integrated circuit 100 and the second insulator 102, even if pressure treatment is performed in bonding the second insulator 102 in the manufacture process, the third insulator 103 diffuses the force, so that damage of the semiconductor integrated circuit 100 can be suppressed. As a result, the semiconductor device can be manufactured with a high yield.

The conductive shields 140a and 140b have functions of transmitting electromagnetic waves which are to be transmitted/received by the antenna 101 included in the semiconductor device and shielding the semiconductor integrated circuit 100 in the semiconductor device from application of static electricity from the outside.

In particular, the conductive shield 140a provided on the surface of the first insulator 112 and the conductive shield 140b provided on the surface of the second insulator 102 are electrically connected, whereby diffusion of static electricity and prevention of localization of electric charges can be performed effectively as compared to the case where the conductive shield 140a and the conductive shield 140b are provided without electrical connection or the case where a conductive shield is provided on only one of the first insulator 112 and the second insulator 102.

Furthermore, damage and deterioration in characteristics of the semiconductor device can be prevented by formation of the first insulator 112 and the second insulator 102 each having resistance to the force applied from the outside to the semiconductor device and formation of the fourth insulator 113 and the third insulator 103 each diffusing the force.

In the above structure of FIG. 15A, the insulator is formed with four layers of the first insulator 112 and the second insulator 102 functioning as an impact resistance layer and the third insulator 103 and the fourth insulator 113 functioning as an impact diffusion layer whose modulus of elasticity is low and breaking strength is high. However, the structure is acceptable as long as at least two insulators sandwiching the antenna 101 and the semiconductor integrated circuit 100 are provided. Thus, three layers or two layers among the above four layers may be used for the insulator. In the case where the insulator has a layered structure, the conductive shields 140a and 140b may be provided on outer surfaces (surfaces on the side opposite to the side of a surface where the semiconductor integrated circuit 100 is provided) of the insulators or between insulators which are stacked.

By the conductive shield covering the semiconductor integrated circuit, electrostatic breakdown of the semiconductor integrated circuit due to electrostatic discharge can be prevented. With a pair of insulators sandwiching the semiconductor integrated circuit, a highly reliable semiconductor device having high resistance while achieving reduction in thickness and size can be provided. Further, defective shapes and deterioration in characteristics due to external stress or electrostatic discharge are prevented even in a manufacture process, so that a semiconductor device can be manufactured with a high yield.

Embodiment 3

In this embodiment, another example of a semiconductor device which is different from that of the above embodiment will be described with reference to FIGS. 17A to 17D. Note that the same portions or portions having a similar function as those of Embodiment 1 are denoted by the same reference numeral through different drawings in a structure of this embodiment to be described hereinafter, and repetitive description thereof is omitted.

Specifically, a case is described, in which after a conductive shield is provided for an insulator in advance, the insulator provided with the conductive shield is bonded to the semiconductor integrated circuit.

Figure 17A:
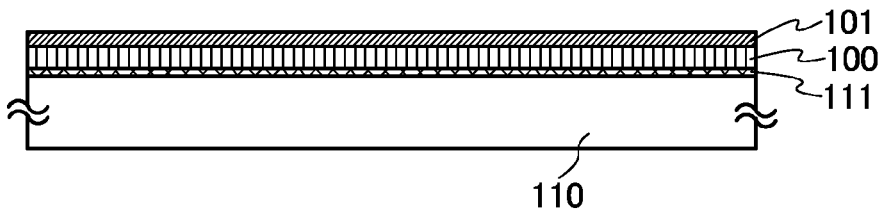
FIGS. 17A to 17D illustrate a method for manufacturing a semiconductor device.
Figure 17B:
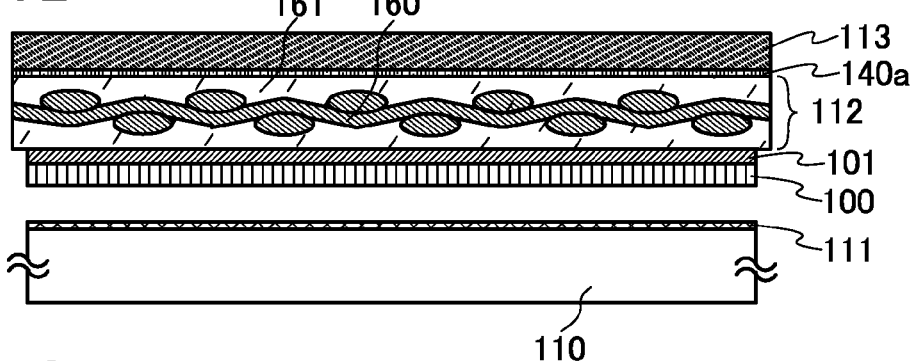
Figure 17C:
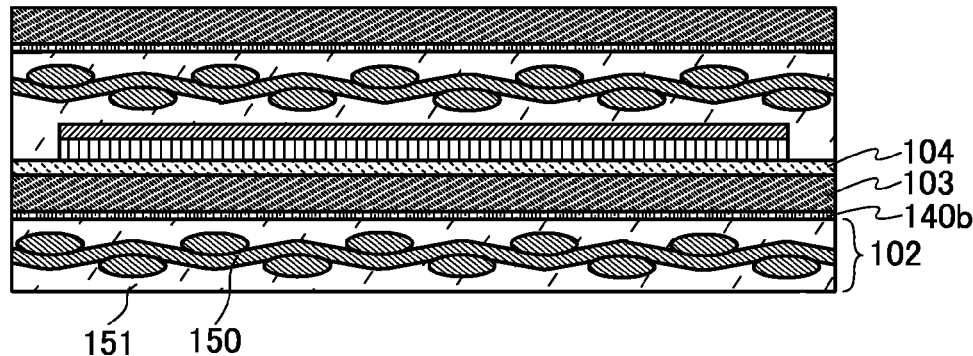

First, the antenna 101 and the semiconductor integrated circuit 100 are formed over the substrate 110 with a separation layer 111 interposed therebetween (see FIG. 17A). Note that FIG. 17A corresponds to FIG. 3A described above.

Next, after the fourth insulator 113 whose one surface is provided with the conductive shield 140a in advance is prepared, a surface of the conductive shield 140a and one of surfaces of the first insulator 112 are made to face each other and the other surface of the first insulator 112 and the antenna 101 are made to face each other. Under such conditions, heat and pressure treatment is performed, whereby the first insulator 112 and the conductive shield 140a, and the first insulator 112 and the antenna 101 are bonded. As a result, the conductive shield 140a is provided between the fourth insulator 113 and the first insulator 112. After that, the antenna 101 and the semiconductor integrated circuit 100 are separated from the substrate 110 by using the separation layer 111 (see FIG. 17B).

Next, after the third insulator 103 whose one surface is provided with the conductive shield 140b in advance is prepared, a surface of the conductive shield 140b and one of surfaces of the second insulator 102 are made to face each other. Under such a condition, heat and pressure treatment is performed, whereby the second insulator 102 and the conductive shield 140b are bonded. As a result, the conductive shield 140b is provided between the third insulator 103 and the second insulator 102. After that, the other surface of the third insulator 103 and an exposed surface of the semiconductor integrated circuit 100 are bonded with the adhesive layer 104 interposed therebetween (see FIG. 17C).

In this case, the conductive shield 140a is provided between the fourth insulator 113 and the first insulator 112, and the conductive shield 140b is provided between the third insulator 103 and the second insulator 102.

Figure 17D:
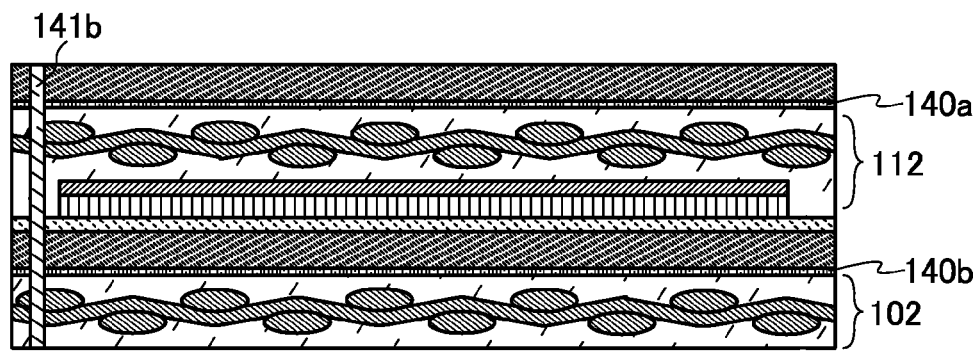

After that, the conductive shield 140a and the conductive shield 140b are electrically connected (see FIG. 17D). Here, the conductor 141b penetrating the insulators is provided, whereby the conductive shield 140a and the conductive shield 140b can be electrically connected.

The structure in which the conductive shield is provided between the stacked insulators in such a manner has an effect of preventing deterioration of the conductive shield, such as oxidation, abrasion, or crack because a surface of the conductive shield is not exposed.

Furthermore, by formation of the first insulator 112 and the second insulator 102 each having resistance to the force applied from the outside to the semiconductor device and formation of the fourth insulator 113 and the third insulator 103 each diffusing the force, local application of the force can be efficiently reduced, so that damage and deterioration in characteristics of the semiconductor device can be prevented.

By the conductive shield covering the semiconductor integrated circuit, electrostatic breakdown of the semiconductor integrated circuit due to electrostatic discharge can be prevented. With a pair of insulators sandwiching the semiconductor integrated circuit, a highly reliable semiconductor device having resistance while achieving reduction in thickness and size can be provided. Further, defective shapes and deterioration in characteristics due to external stress or electrostatic discharge are prevented even in a manufacture process, so that a semiconductor device can be manufactured with a high yield.

Embodiment 4

In this embodiment, a manufacturing method of a semiconductor device which is different from that of the above embodiment will be described with reference to drawings.

Figure 4A:
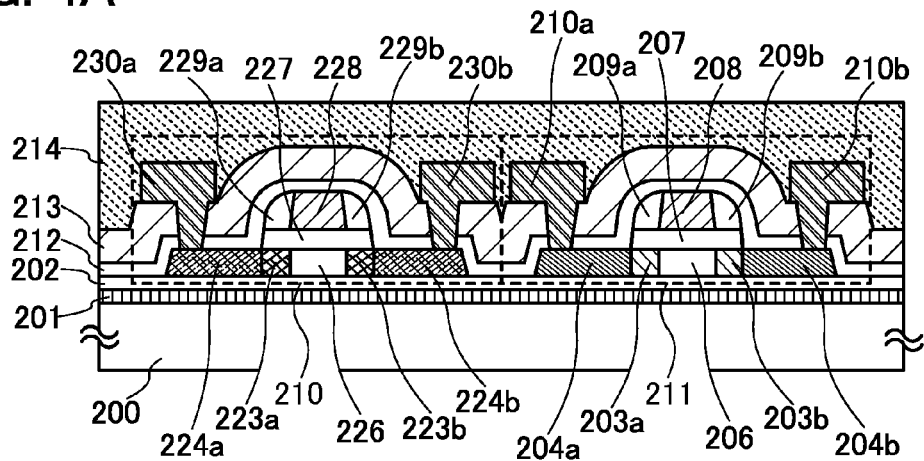
FIGS. 4A to 4C illustrate a method for manufacturing a semiconductor device.

First, transistors 210 and 211 are formed over a substrate 200 having an insulating surface with a separation layer 201 and an insulating film 202 interposed therebetween, and an insulating film 212, an insulating film 213, and an insulating layer 214 are formed so as to cover the transistors 210 and 211 (see FIG. 4A).

The transistor 210 is a thin film transistor and includes source and drain regions 224a and 224b; impurity regions 223a and 223b the concentrations of impurity of which are lower than those of the source and drain regions 224a and 224b; a channel formation region 226; a gate insulating layer 227; a gate electrode layer 228; and insulating layers 229a and 229b with a sidewall structure. The source and drain regions 224a and 224b are respectively in contact with wiring layers 230a and 230b which function as source and drain electrode layers to be electrically connected. In this embodiment, the transistor 210 is a p-channel thin film transistor, in which an impurity element imparting p-type conductivity (e.g., boron (B), aluminum (Al), or gallium (Ga)) is contained in the source and drain regions 224a and 224b and the impurity regions 223a and 223b which are LDD (lightly doped drain) regions.

The transistor 211 is a thin film transistor and includes source and drain regions 204a and 204b; impurity regions 203a and 203b the concentrations of impurity of which are lower than those of the source and drain regions 204a and 204b; a channel formation region 206; a gate insulating layer 207; a gate electrode layer 208; and insulating layers 209a and 209b with a sidewall structure. The source and drain regions 204a and 204b are respectively in contact with wiring layers 210a and 210b which function as source and drain electrode layers to be electrically connected. In this embodiment, the transistor 211 is an n-channel thin film transistor, in which an impurity element imparting n-type conductivity (e.g., phosphorus (P) or arsenic (As)) is contained in the source and drain regions 204a and 204b and the impurity regions 203a and 203b which are LDD (lightly doped drain) regions.

Figure 4B:
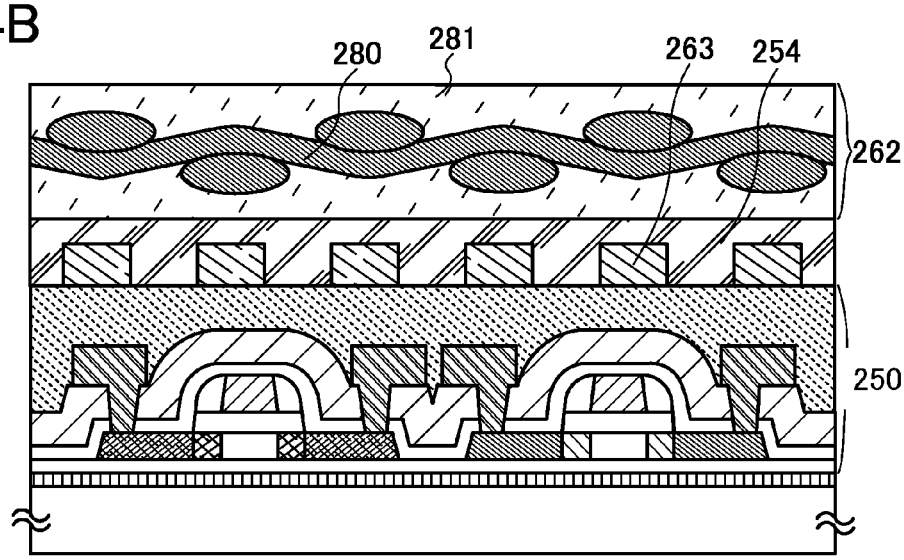

Next, a conductive layer 263 functioning as an antenna is formed over the insulating layer 214, and an inorganic insulating layer 254 is formed as a protective layer over the conductive layer 263. Then, a first insulator 262 is formed over the inorganic insulating layer 254 (see FIG. 4B). Note that the conductive layer 263 is formed so as to be electrically connected to the semiconductor integrated circuit 250.

In this embodiment, a silicon nitride film can be used as the inorganic insulating layer 254.

As the first insulator 262, a structure body in which a fibrous body 280 is impregnated with an organic resin 281 can be used.

Figure 4C:
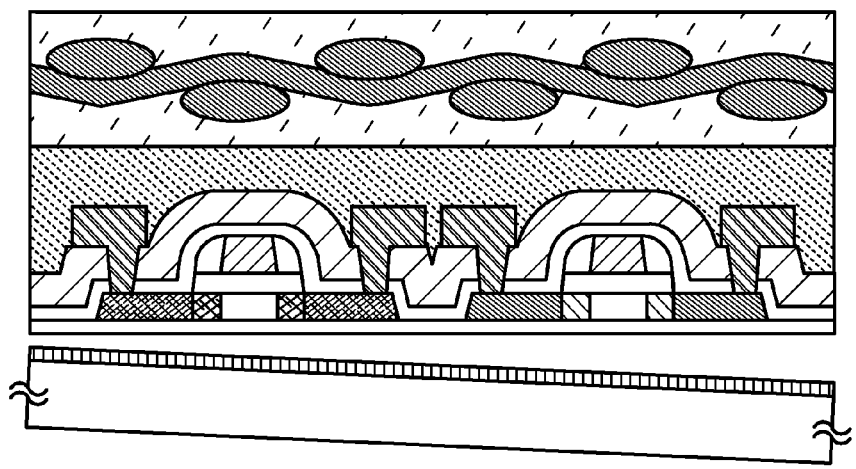

Next, the semiconductor integrated circuit 250 is separated from the substrate 200 by using the separation layer 201 (see FIG. 4C). As a result, the semiconductor integrated circuit 250 is provided on the first insulator 262 side.

Figure 5A:
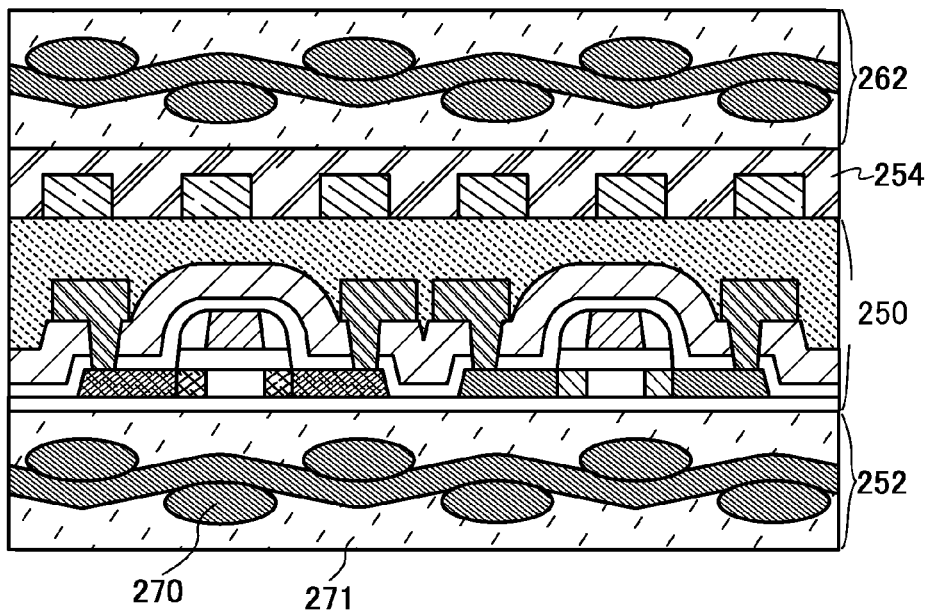
FIGS. 5A and 5B illustrate a method for manufacturing a semiconductor device.

Next, a second insulator 252 is formed so as to be in contact with a surface exposed by the separation (see FIG. 5A). Specifically, a structure body of the second insulator 252 is heated and subjected to pressure bonding, and then bonded to the exposed separation surface of the semiconductor integrated circuit 250, so that the inorganic insulating layer 254, the conductive layer 263, and the semiconductor integrated circuit 250 are sandwiched by the first insulator 262 and the second insulator 252.

As the second insulator 252, a structure body in which a fibrous body 270 is impregnated with an organic resin 271 can be used, as in the case of the first insulator 262.

Figure 5B:
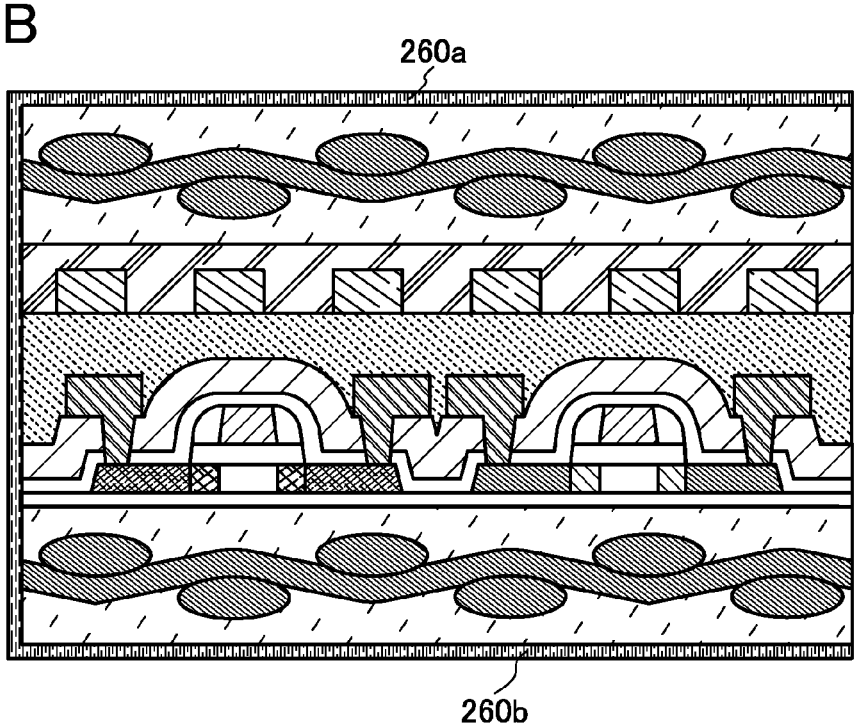

Next, a conductive shield 260a is formed on a surface of the first insulator 262, a conductive shield 260b is formed on a surface of the second insulator 252, and the conductive shield 260a and the conductive shield 260b are electrically connected (see FIG. 5B). In this embodiment, the conductive shields 260a and 260b can be a titanium film which can be formed by a sputtering method to a thickness of about 10 nm. Further, electrical connection between the conductive shield 260a and the conductive shield 260b can be obtained by forming a titanium film on a side surface of the first insulator 262 and a side surface of the second insulator 252 by a sputtering method.

Note that after the conductive shield 260a and the conductive shied 260b are formed on the surface of the first insulator 262 and the surface of the second insulator 252, a conductor is made to penetrate through the first insulator 262 and the second insulator 252, whereby the conductive shield 260a and the conductive shield 260b may be electrically connected.

In the practical manufacture process, a plurality of semiconductor integrated circuits which are apart from each other and a plurality of antennas which are apart from each other are sandwiched between the first insulator 262 and the second insulator 252. After the semiconductor integrated circuits are cut off into individual of semiconductor integrated circuits, the conductive shields 260a and 260b are formed, so that a semiconductor integrated circuit chip can be obtained. There is no particular limitation on a cutoff means as long as the semiconductor integrated circuits can be cut off physically. For example, the semiconductor integrated circuits can be cut off by laser irradiation. Cutoff between a plurality of the semiconductor integrated circuits makes a structure in which the semiconductor integrated circuit 250 and the conductive layer 263 are sealed with the first insulator 262 and the second insulator 252.

Therefore, the conductive layer 263 and the semiconductor integrated circuit 250 are sealed with the first insulator 262 and the second insulator 252 and protected against electrostatic discharge by the conductive shields 260a and 260b which are provided on outer sides of the first insulator 262 and the second insulator 252 corresponding to a top surface and a bottom surface, respectively, of the semiconductor device.

Further, since the insulators and the conductive shields are provided sandwiching the semiconductor integrated circuit, adverse affect such as damage of the semiconductor integrated circuit and deterioration in characteristics due to external stress or electrostatic discharge can be prevented. Thus, the semiconductor device can be manufactured with a high yield.

Note that, the semiconductor device described in this embodiment can be a flexible semiconductor device by using flexible insulators.

Next, a material and the like used in the above manufacture process are described in detail.

As a material for forming a semiconductor layer included in the transistors 210 and 211, an amorphous semiconductor (hereinafter also referred to as AS) formed using a semiconductor material gas typified by silane or germane by a vapor phase growth method or a sputtering method, a polycrystalline semiconductor formed by crystallizing the amorphous semiconductor by utilizing light energy or thermal energy, a microcrystalline (also referred to as semiamorphous or microcrystal) semiconductor (hereinafter also referred to as SAS), or the like can be used. The semiconductor layer can be formed by a sputtering method, an LPCVD method, a plasma CVD method, or the like.

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single-crystalline silicon. That is, the peak of the Raman spectrum of the microcrystalline silicon exists between 520 cm$^{-1}$ which represents single crystal silicon and 480 cm$^{-1}$ which represents amorphous silicon. The semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor layer can be obtained.

The microcrystalline semiconductor layer can be formed by a high-frequency plasma CVD method with a frequency of several tens to several hundreds of megahertz or a microwave plasma CVD apparatus with a frequency of 1 GHz or more. The microcrystalline semiconductor layer can be typically formed using a dilution of silicon hydride such as SiH$_4$, Si$_2$H$_6$, SiH$_2$Cl$_2$, SiHCl$_3$, SiCl$_4$, or SiF$_4$ with hydrogen. With a dilution with one or plural kinds of rare gas elements of helium, argon, krypton, and neon in addition to silicon hydride and hydrogen, the microcrystalline semiconductor layer can be formed. In that case, the flow ratio of hydrogen to silicon hydride is set to be 5:1 to 200:1, preferably 50:1 to 150:1, more preferably 100:1.

Hydrogenated amorphous silicon can be typically cited as the amorphous semiconductor, while polysilicon or the like can be typically cited as crystalline semiconductor. Examples of polysilicon (polycrystalline silicon) include so-called high-temperature polysilicon that contains polysilicon as a main component and is formed at a process temperature of 800° C. or higher, so-called low-temperature polysilicon that contains polysilicon as a main component and is formed at a process temperature of 600° C. or lower, polysilicon obtained by crystallizing amorphous silicon by using an element that promotes crystallization or the like, and the like. Naturally, as described above, a microcrystalline semiconductor or a semiconductor which includes a crystalline phase in a portion of a semiconductor layer can be used.

As a material of the semiconductor, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide (SnO$_2$), magnesium oxide zinc, gallium oxide, or indium oxide; an oxide semiconductor formed using a plural elements of the above oxide semiconductors; or the like can be used. For example, an oxide semiconductor formed using zinc oxide, indium oxide, and gallium oxide; or the like can be used. Note that in the case of using zinc oxide for the semiconductor layer, a single layer or a stacked layer of Y$_2$O$_3$, Al$_2$O$_3$, or TiO$_2$ is preferably used as the gate insulating layer, and ITO, Au, Ti, or the like is preferably used for the gate electrode layer, the source electrode layer, or the drain electrode layer. In addition, In, Ga, or the like can be added to ZnO.

In the case of using a crystalline semiconductor layer for the semiconductor layer, the crystalline semiconductor layer may be formed by various methods (such as a laser crystallization method, a thermal crystallization method, or a thermal crystallization method using an element which promotes crystallization, such as nickel). Also, a microcrystalline semiconductor, which is an SAS, can be crystallized by performing irradiation with a laser beam to increase its crystallinity. In the case where the element promoting crystallization is not introduced, hydrogen is released until the concentration of hydrogen contained in an amorphous silicon layer becomes $1 \times 10^{20}$ atoms/cm$^3$ or less by heating the amorphous silicon layer at a temperature of 500° C. for one hour under a nitrogen atmosphere before irradiating the amorphous silicon layer with a laser beam. This is because the amorphous silicon layer is damaged when the amorphous silicon layer containing a high amount of hydrogen is irradiated with a laser beam.

There is no particularly limitation on a technique for introducing a metal element into an amorphous semiconductor layer as long as it is a technique capable of providing the metal element on a surface or the inside of the amorphous semiconductor layer. For example, a sputtering method, a CVD method, a plasma processing method (including a plasma CVD method), an adsorption method, or a method for coating with a solution of metal salt, can be used. In the above mentioned processes, the method using a solution is convenient and has an advantage of easily adjusting the concentration of a metal element. In addition, in order to improve the wettability of the surface of the amorphous semiconductor layer to spread an aqueous solution on the whole surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

The crystallization may be performed by adding an element which promotes crystallization (also referred to as a catalyst element or a metal element) to an amorphous semiconductor layer and performing a heat treatment (at 550° C. to 750° C. for 3 minutes to 24 hours) in a crystallization step in which the amorphous semiconductor layer is crystallized to form a crystalline semiconductor layer. The element which promotes the crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor layer, a semiconductor layer containing an impurity element is formed to be in contact with the crystalline semiconductor layer so as to serve as a gettering sink. The impurity element may be an impurity element imparting n-type conductivity, an impurity element imparting p-type conductivity, or a rare gas element. For example, one or plural, elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation treatment. The heat treatment or the laser light irradiation treatment may be carried out several times, separately.

Also, a crystalline semiconductor layer may be formed over a substrate directly by a plasma method. Alternatively, the crystalline semiconductor layer may be selectively formed over a substrate by using a plasma method.

The gate insulating layers 207 and 227 may be formed using silicon oxide, or may be formed with a layered structure of silicon oxide and silicon nitride. The gate insulating layers 207 and 227 may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability. For example, dinitrogen monoxide (N$_2$O) is diluted with Ar by 1 to 3 times (flow ratio) and a microwave (2.45 GHz) with a power of 3 kW to 5 kW is applied at a pressure of 10 Pa to 30 Pa to oxidize or nitride surface of the semiconductor layer. By this treatment, an insulating film having a thickness of 1 nm to 10 nm (preferably 2 nm to 6 nm) is formed. Further, dinitrogen monoxide (N$_2$O) and silane (SiH$_4$) are introduced, and a silicon oxynitride film is formed by a vapor deposition method by application of a microwave (2.45 GHz) power of 3 kW to 5 kW at a pressure of 10 Pa to 30 Pa; accordingly, the gate insulating layer is formed. The combination of the solid phase reaction and the reaction by the vapor deposition method can form a gate insulating layer with a low interface state density and an excellent withstand voltage.

As the gate insulating layers 207 and 227, a high dielectric constant material such as zirconium dioxide, hafnium oxide, titanium dioxide, or tantalum pentoxide may be used. When a high dielectric constant material is used for the gate insulating layers 207 and 227, gate leak current can be reduced.

The gate electrode layers 208 and 228 can be formed by a CVD method, a sputtering method, a droplet discharge method, or the like. The gate electrode layers may be formed using an element selected from Ag, Au, Cu, Ni, Pt, Pd, Ir, Rh, W, Al, Ta, Mo, Cd, Zn, Fe, Ti, Si, Ge, Zr, or Ba; or an alloy material or a compound material containing any of the elements as its main component. Alternatively, a semiconductor film typified by a polycrystalline silicon film doped with an impurity element such as phosphorus, or an AgPdCu alloy may be used. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film.

A light-transmitting material having a transmitting property to visible light can also be used for the gate electrode layers 208 and 228. As the light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide (SnO$_2$), indium oxide containing tungsten oxide, indium zinc oxide containing tungsten oxide, indium oxide containing titanium oxide, indium tin oxide containing titanium oxide, or the like may be used.

If etching processing is required to form the gate electrode layers 208 and 228, a mask may be formed and dry etching or wet etching may be performed. By using an ICP (inductively coupled plasma) etching method and controlling etching conditions (e.g., the amount of electric power applied to a coiled electrode, the amount of electric power applied to an electrode on a substrate side, or the electrode temperature on the substrate side) as appropriate, the electrode layer can be etched into a tapered shape. Note that as an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be used as appropriate.

The insulating layers 209a, 209b, 229a, and 229b having a sidewall structure may be formed in a self-aligning manner by forming an insulating layer, which covers the gate electrode layers and the semiconductor layers, and processing the insulating layer by anisotropic etching of an RIE (reactive ion etching) method. Here, there is no particular limitations on the insulating layer, but the insulating layer is preferably formed using silicon oxide which is formed by reacting TEOS (tetraethyl orthosilicate), silane, or the like and oxygen, nitrous oxide, or the like and which has favorable step coverage. The insulating layer can be formed by a thermal CVD method, a plasma CVD method, a normal-pressure CVD method, a bias ECRCVD method, a sputtering method, or the like.

Although a single gate structure is described in this embodiment mode, a multi-gate structure such as a double-gate structure may also be employed. In this case, gate electrode layers may be provided above and below the semiconductor layer or a plurality of gate electrode layers may be provided only on one side (above or below) of the semiconductor layer.

Alternatively, a structure in which a silicide is provided for a source region and a drain region of a transistor may be employed. A silicide is formed by forming a conductive film over the source and drain regions of the semiconductor layer and making silicon in the source and drain regions, which are partly exposed, of the semiconductor layer and the conductive film react by heat treatment, a GRTA method, an LRTA method, or the like. Alternatively, a silicide may be formed by light irradiation using a laser beam or a lamp. As a material used for a conductive film for forming the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

The wiring layers 210a, 210b, 230a, and 230b serving as the source and drain electrode layers can be formed by depositing a conductive film by a PVD method, a CVD method, an evaporation method, or the like, and then, etching the conductive film into desired shapes. Alternatively, the wiring layers can be formed selectively at a predetermined place by a printing method, an electroplating method, or the like. Further, a reflow method and a damascene method may be used as well. As a material of the wiring layers 210a, 210b, 230a, and 230b, a metal such as Ag, Au, Cu, Ni, Pt, Pd, Ir, Rh, W, Al, Ta, Mo, Cd, Zn, Fe, Ti, Zr, or Ba; or a semiconductor such as Si or Ge or an alloy thereof, or nitride thereof may be used. Further, a light-transmitting material can also be used.

When the wiring layers are formed using the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

Silicon oxide, silicon nitride, silicon oxynitride, aluminum oxide, aluminum nitride, aluminum oxynitride, or another inorganic insulating material can be used for the insulating films 212, 213, and 214.

By the conductive shield covering the semiconductor integrated circuit, electrostatic breakdown (malfunction of the circuit or damage of the semiconductor element) of the semiconductor integrated circuit due to electrostatic discharge can be prevented. With a pair of insulators sandwiching the semiconductor integrated circuit, a highly reliable semiconductor device having high resistance while achieving reduction in thickness and size can be provided. Further, defective shapes and deterioration in characteristics due to external stress or electrostatic discharge are prevented even in a manufacture process, so that a semiconductor device can be manufactured with a high yield.

In the semiconductor device of this embodiment, not to mention a field-effect transistor, a memory element which uses a semiconductor layer or the like can be employed as a semiconductor element; accordingly, a semiconductor device which can satisfy functions required for various applications can be manufactured and provided.

Embodiment 5

In this embodiment, an example of a semiconductor device including a memory and a manufacturing method thereof will be described with reference to FIGS. 6A to 6E, FIGS. 7A to 7C, and FIGS. 8A and 8B.

A semiconductor device of this embodiment includes a memory cell array and a driver circuit portion which drives the memory cell array.

First, a separation layer 301 is formed over a substrate 300 having an insulating surface, and an insulating film 302 functioning as a base over the separation layer 301.

Next, a semiconductor film is formed over the insulating film 302. The semiconductor film may be formed by a sputtering method, an LPCVD method, a plasma CVD method or the like to be 25 to 200 nm thick (preferably, 30 to 150 nm thick).

In this embodiment, an amorphous semiconductor film is formed over the insulating film 302, and the amorphous semiconductor film is crystallized by laser beam irradiation; accordingly, a semiconductor film that is a crystalline semiconductor film is formed.

The semiconductor film obtained as described above may be doped with the slight amount of impurity elements (boron or phosphorus) selectively for controlling threshold voltage of a thin film transistor. This doping of impurity elements may be performed on an amorphous semiconductor film before crystallization. When the amorphous semiconductor film is doped with impurity elements, the impurities can be activated by heat treatment for crystallization later. Further, a defect and the like generated in the doping can be improved as well.

Next, the semiconductor film is processed into a desired shape using a mask. In this embodiment, after an oxide film formed on the semiconductor film is removed, another oxide film is formed. Then, a photomask is formed, and processing treatment using photolithography is performed, so that semiconductor layers 303, 304, 305, and 306 are formed. For end portions of the semiconductor layers, inclination angles (taper angles) may be provided.

The etching may be carried out by either plasma etching (dry etching) or wet etching. For treating a large-sized substrate, plasma etching is suitable. As an etching gas, a gas containing fluorine or chlorine, such as $CF_4$, $NF_3$, $Cl_2$, or $BCl_3$ is used, and an inert gas such as He or Ar may be added thereto as appropriate. Alternatively, localized electric discharge is possible when the etching is employed by atmospheric pressure discharge, and thus etching can be performed without forming a mask over an entire substrate.

Next, an insulating film 310 is formed over the semiconductor layer 305. The insulating film 310 may be formed using silicon oxide or a layered structure of silicon oxide and silicon nitride. The insulating film 310 may be formed by deposition of the insulating layer by a plasma CVD method or a low pressure CVD method. It is preferable that the insulating layer be subjected to solid-phase oxidation or solid-phase nitriding by plasma treatment to form the insulating film 310. This is because an insulating layer which is formed through oxidation or nitridation of the semiconductor layer (typically, a silicon layer) by plasma treatment has a dense film quality, high withstand voltage, and high reliability. The insulating film 310 is used as a tunnel insulating layer for injecting charges into a charge accumulation layer 311; therefore, a strong insulating layer is preferred. This insulating film 310 is preferably formed to have a thickness of 1 nm to 20 nm, and preferably 3 nm to 6 nm.

The insulating film 310 is preferably formed by plasma treatment in such a way that, for example, a silicon oxide layer is formed with a thickness of 3 nm to 6 nm over the semiconductor layer by plasma treatment under an oxygen atmosphere, and a nitrogen-plasma-treated layer is formed by treating the surface of the silicon oxide layer with nitrogen plasma under a nitrogen atmosphere. Specifically, first, a silicon oxide layer with a thickness of 3 nm to 6 nm is formed over the semiconductor layer by plasma treatment under an oxygen atmosphere. Then, a nitrogen-plasma-treated layer with a high concentration of nitrogen is formed over the surface or in the vicinity of the surface of the silicon oxide layer by performance of plasma treatment under a nitrogen atmosphere successively. Note that the surface vicinity refers to a depth of approximately 0.5 nm to 1.5 nm from a surface of the silicon oxide layer. For example, by conducting plasma treatment under a nitrogen atmosphere, a structure is obtained in which the silicon oxide layer contains 20 at. % to 50 at. % nitrogen in a region from the surface to a depth of about 1 nm.

A surface of a silicon layer as a typical example of the semiconductor layer is oxidized by plasma treatment, whereby a dense oxide layer that has no distortion in an interface can be formed. In addition, through nitridation by plasma treatment of the oxide layer, oxygen on a portion of a surface is substituted for by nitrogen and a nitrogen layer is formed, whereby the layer can be made even denser. Consequently, an insulating layer which is high in withstand voltage can be formed.

In any event, through use of the aforementioned solid phase oxidation or solid phase nitridation by plasma treatment, even if a glass substrate with a heat resistance temperature of 700° C. or lower is used, an insulating layer equal to a thermal oxidation film that is formed at a temperature of 950° C. to 1050° C. can be obtained. Thus, a tunnel insulating layer having high reliability can be formed as the tunnel insulating layer of a nonvolatile memory element.

The charge accumulation layer 311 is formed over the insulating film 310. This charge accumulation layer 311 may be provided to have a single layer or a layered structure The charge accumulation layer 311 can be formed of a layer or particles of a semiconductor material or a conductive material to be a floating gate. As the semiconductor material, silicon, silicon germanium, or the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), or tungsten (W); an alloy containing the above element as its main component; an alloy film in which the above elements are combined (typically, an Mo—W alloy film or an Mo—Ta alloy film); or a silicon film given conductivity can be used. Under the conductive layer formed using such a material, a nitride such as tantalum nitride, tungsten nitride, titanium nitride, or molybdenum nitride; or a silicide such as tungsten silicide, titanium silicide, or molybdenum silicide may be formed. Furthermore, a layered structure of the above-described semiconductor materials, conductive materials, or the semiconductor material and the conductive material may be employed. For example, a layered structure of a silicon layer and a germanium layer may be employed.

Alternatively, the charge accumulation layer 311 can be formed as an insulating layer having a trap that holds charges. As a typical example of such a material, a silicon compound and a germanium compound are given. As the silicon compound, silicon nitride, silicon oxynitride, silicon oxynitride to which hydrogen is added, or the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, resist masks for covering the semiconductor layers 303, 304, and 306 are formed. An impurity element imparting n-type conductivity is added using the resist masks and the charge accumulation layer 311 as masks to form an n-type impurity region 362a and an n-type impurity region 362b. In this embodiment, phosphorus (P) which is an impurity element imparting n-type conductivity is used as the impurity element. Here, the impurity element imparting n-type conductivity is added so that the n-type impurity region 362a and the n-type impurity region 362b contain the impurity element at a concentration of about $1 \times 10^{17}$ atoms/cm$^3$ to $5 \times 10^{18}$ atoms/cm$^3$. After that, the resist masks covering the semiconductor layers 303, 304, and 306 are removed.

An oxide film over the semiconductor layer 306 is removed, and a gate insulating layer 309 covering the semiconductor layer 305, the semiconductor layer 306, the insulating film 310, and the charge accumulation layer 311 is formed. When the gate insulating layer 309 has a large thickness in a memory cell array, the thin film transistor and the memory element can have high resistance to high voltage; accordingly reliability can be improved.

Note that although the gate insulating layer 309 formed over the semiconductor layer 305 serves as a control insulating layer in a memory element which is completed later, it serves as a gate insulating layer over the semiconductor layer 306. Therefore, the layer is called the gate insulating layer 309 in this specification.

Figure 6A:
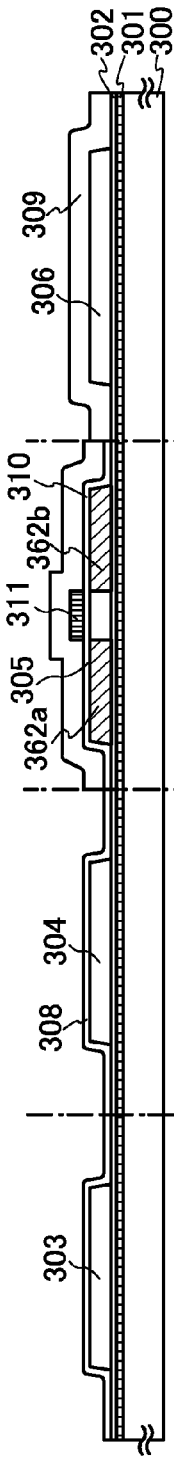
FIGS. 6A to 6E illustrate a method for manufacturing a semiconductor device.

Next, the gate insulating layer 309 over the semiconductor layers 303 and 304 are removed, and a gate insulating layer 308 covering the semiconductor layer 303 and the semiconductor layer 304 are formed (see FIG. 6A). The gate insulating layer 308 can be formed by a plasma CVD method, a sputtering method, or the like. The thickness of the gate insulating layer 308 of a thin film transistor provided in the driver circuit portion is from 1 nm to 10 nm, more preferably about 5 nm. When the gate insulating layer 308 is to be thinned, the transistor in the driver circuit portion can be made to operate with low voltage at high speed.

The gate insulating layer 308 may be formed using silicon oxide or with a layered structure of silicon oxide and silicon nitride. The gate insulating layer 308 may be formed by depositing an insulating film by a plasma CVD method or a low pressure CVD method or may be formed by solid phase oxidation or solid phase nitridation by plasma treatment. This is because a gate insulating layer formed by oxidizing or nitriding a semiconductor layer by plasma treatment is dense, and has high dielectric strength and excellent reliability.

As the gate insulating layer 308, a high dielectric constant material may be used. When a high dielectric constant material is used for the gate insulating layer 308, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. Note that a rare gas element such as argon is preferably included in a reactive gas and is preferably mixed in the insulating film to be formed in order to form a dense insulating film with few gate leak current at a low film-formation temperature.

Next, a first conductive film having a thickness of 20 nm to 100 nm and a second conductive film having a thickness of 100 nm to 400 nm, each of which serves as a gate electrode layer, are stacked over the gate insulating layers 308 and 309. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), chromium (Cr), or neodymium (Nd), or an alloy or compound material containing the above material as a main component. Alternatively, the first conductive film and the second conductive film may be formed of a semiconductor film typified by a polycrystalline silicon film doped with an impurity element such as phosphorus, or an AgPdCu alloy film. The conductive film is not limited to the two-layer structure, and, for example, may have a three-layer structure in which a tungsten film with a thickness of 50 nm, an aluminum-silicon alloy (Al—Si) film with a thickness of 500 nm, and a titanium nitride film with a thickness of 30 nm are sequentially stacked. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Alternatively, a single-layer structure may be adopted as well. In this embodiment, tantalum nitride is formed to a thickness of 30 nm for the first conductive film, and tungsten (W) is formed to a thickness of 370 nm for the second conductive film.

Figure 6B:
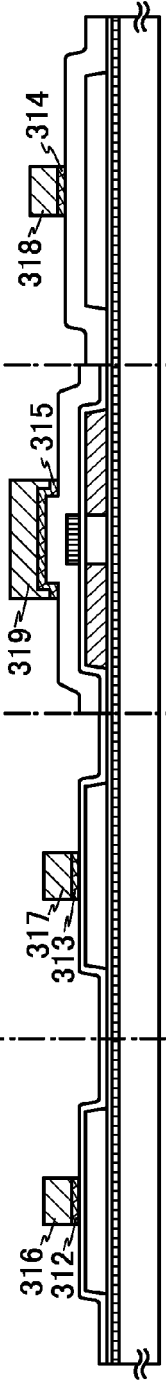
Figure 6C:
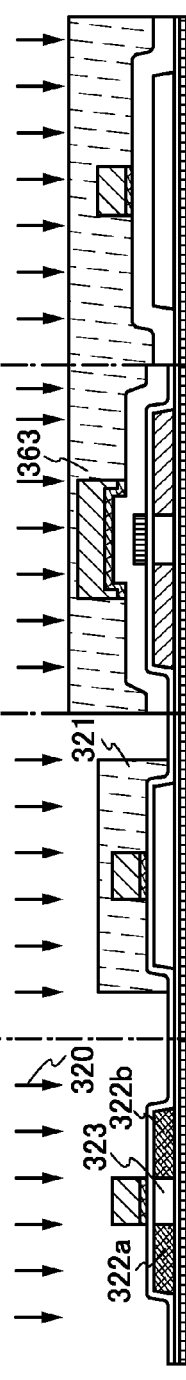
Figure 6D:
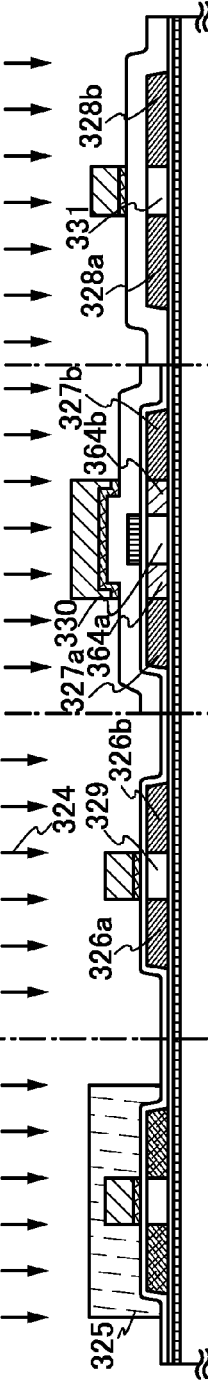

The first conductive film and the second conductive film are etched to form first gate electrode layers 312, 313, and 314; second gate electrode layers 316, 317, and 318; a first control gate electrode layer 315; and a second control gate electrode layer 319 (see FIG. 6B).

In this embodiment, an example in which the first gate electrode layer and the second gate electrode layer (the first control gate electrode layer and the second control gate electrode layer) are formed to have perpendicular side surfaces is shown; however, this embodiment is not limited thereto. Both the first gate electrode layer and the second gate electrode layer (the first control gate electrode layer and the second control gate electrode layer) may have tapered shapes, or either the first gate electrode layer or the second gate electrode layer (the first control gate electrode layer or the second control gate electrode layer) may have tapered shapes while the other gate electrode layer may have perpendicular side surfaces by anisotropic etching. The taper angles may be different or equal among the stacked gate electrode layers. With the tapered shape, coverage of a film stacked thereover is improved and defects are reduced, which improves reliability.

The gate insulating layers 308 and 309 may be etched to some extent and thinned (so-called film reduction) by the etching step in forming the gate electrode layers (and the control gate electrode layers).

Next, a mask 321 covering the semiconductor layer 304 and a mask 363 covering the semiconductor layers 305 and 306 are formed. An impurity element 320 imparting p-type conductivity is added using the masks 321 and 363, the first gate electrode layer 312, and the second gate electrode layer 316 as a mask to form a p-type impurity region 322a and a p-type impurity region 322b. In this embodiment, boron (B) is used as the impurity element. Here, doping is performed so that the p-type impurity region 322a and the p-type impurity region 322b contain the impurity element imparting p-type conductivity at a concentration of about $1\times10^{20}$ atoms/cm$^3$ to $5\times10^{21}$ atoms/cm$^3$. Further, a channel formation region 323 is formed in the semiconductor layer 303 (see FIG. 6C).

The p-type impurity region 322a and the p-type impurity region 322b are high concentration p-type impurity regions which serve as a source region and a drain region.

Next, a mask 325 covering the semiconductor layer 303 is formed. An impurity element 324 imparting n-type conductivity is added using the mask 325, the first gate electrode layer 313, the second gate electrode layer 317, the first gate electrode layer 314, the second gate electrode layer 318, the first control gate electrode layer 315, and the second control gate electrode layer 319 as masks to form n-type impurity regions 326a, 326b, 364a, 364b, 327a, 327b, 328a, and 328b. In this embodiment, phosphorus (P) is used as the impurity element. Here, the impurity element imparting n-type conductivity is added so that the n-type impurity regions 326a, 326b, 327a, 327b, 328a, and 328b contains the n-type impurity element at concentrations of approximately $5\times10^{19}$ atoms/cm$^3$ to $5\times10^{20}$ atoms/cm$^3$. Further, a channel formation region 329, a channel formation region 330, and a channel formation region 331 are formed in the semiconductor layer 304, the semiconductor layer 305, and the semiconductor layer 306, respectively (see FIG. 6D).

The n-type impurity regions 326a, 326b, 327a, 327b, 328a, and 328b are high concentration n-type impurity regions which serve as source regions and drain regions. On the other hand, the n-type impurity region 364a and the n-type impurity region 364b are low concentration impurity regions which become LDD regions.

The mask 325 is removed by O$_2$ ashing or with a resist stripper. After that, an insulating film, namely a sidewall may be formed so as to cover sides of the gate electrode layers. The sidewall may be formed of an insulating film containing silicon by a plasma CVD method or a low pressure CVD (LPCVD) method.

In order to activate the impurity element, heat treatment, strong light irradiation, or laser light irradiation may be performed. At the same time as the activation, a plasma damage to the gate insulating layer and to an interface between the gate insulating layer and the semiconductor layer can be reduced.

Next, an interlayer insulating layer which covers the gate insulating layers and the gate electrode layers is formed. In this embodiment, a stacked-layer structure of an insulating film 367 and an insulating film 368 is employed. The insulating film 367 and the insulating film 368 each may be a silicon nitride film, a silicon nitride oxide film, a silicon oxynitride film, or a silicon oxide film formed by a sputtering method or a plasma CVD method. Further, another insulating film containing silicon may also be employed to have a single-layer structure or a stacked-layer structure including three or more layers.

Further, heat treatment is performed in a nitrogen atmosphere at 300° C. to 550° C. for 1 to 12 hours, whereby the semiconductor layer is hydrogenated. Preferably, this step is performed at 400° C. to 500° C. Through this step, dangling bonds in the semiconductor layer can be terminated by hydrogen contained in the insulating film 367 that is an interlayer insulating layer. In this embodiment, heat treatment is performed at 410° C. for one hour.

The insulating film 367 and the insulating film 368 can be formed using a material selected from inorganic insulating materials, such as aluminum nitride (AlN), aluminum oxynitride (AlON) containing a larger amount of oxygen than that of nitrogen, aluminum nitride oxide (AlNO) containing a larger amount of nitrogen than that of oxygen, aluminum oxide, diamond-like carbon (DLC), or nitrogen-containing carbon (CN). In addition, a siloxane resin may also be used. The siloxane resin corresponds to a resin including Si—O—Si bonding.

Next, using a resist mask, contact holes (openings) that reach the semiconductor layers are formed in the insulating films 367 and 368, and the gate insulating layers 308 and 309. Etching may be performed once or plural times according to a selection ratio of the materials to be used. The insulating films 367 and 368 and the gate insulating layers 308 and 309 are partly removed by etching to form openings which reach the p-type impurity regions 322a and 322b and the n-type impurity regions 326a, 326b, 327a, 327b, 328a, and 328b, which are source regions and drain regions. For the etching, wet etching, dry etching, or the both may be employed. A hydrofluoric acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas. As an inert element to be added, one or a plurality of elements selected from He, Ne, Ar, Kr, and Xe can be used.

A conductive film is formed so as to cover the openings, and the conductive film is etched to form wiring layers 369a, 369b, 370a, 370b, 371a, 371b, 372a, and 372b, which are source electrode layers and drain electrode layers electrically connected to parts of source regions and drain regions. The wiring layers can be formed by forming the conductive film by a PVD method, a CVD method, an evaporation method, or the like, and then, etching the conductive film into a desired shape. In addition, a conductive layer can be selectively formed in a predetermined position by a droplet discharge method, a printing method, an electrolytic plating method, or the like. Further, a reflow method or a damascene method may be used as well. As a material for the source and the drain electrode layers, a metal such as Ag, Au, Cu, Ni, Pt, Pd, Ir, Rh, W, Al, Ta, Mo, Cd, Zn, Fe, Ti, Zr, or Ba, or Si or Ge, an alloy thereof or nitride thereof can be used. Further, a layered structure of these may be used. In this embodiment, titanium (Ti) is formed to be 60 nm thick, titanium nitride is formed to be 40 nm thick, aluminum is formed to be 700 nm thick, and titanium (Ti) is formed to be 200 nm thick, and then, the stacked film is processed into a desired shape.

Figure 6E:
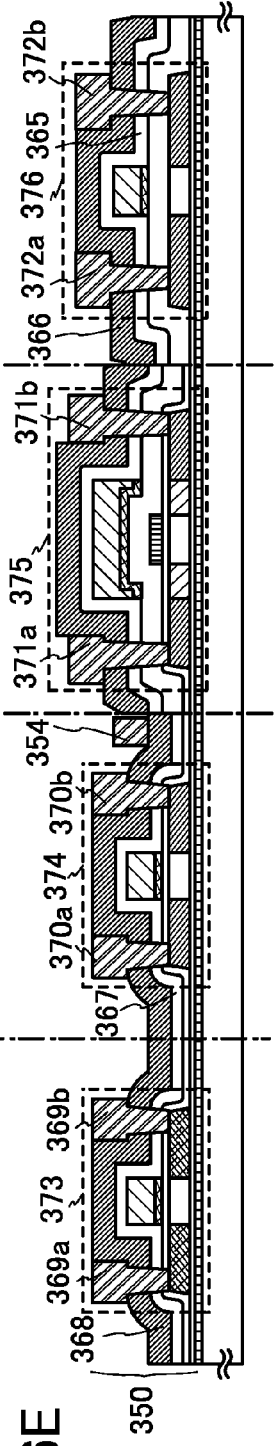

Through the above steps, a semiconductor integrated circuit 350 can be formed, which includes, in a driver circuit portion, a thin film transistor 373 which is a p-channel thin film transistor having p-type impurity regions and a thin film transistor 374 which is an n-channel thin film transistor having n-type impurity regions; and in a memory cell array, a memory element 375 having n-type impurity regions and a thin film transistor 376 which is an n-channel thin film transistor having n-type impurity regions (see FIG. 6E).

Next, an insulating layer 390 is formed over the semiconductor integrated circuit 350 (see FIG. 7A).

Then, a conductive layer 380 functioning as an antenna is formed over the insulating layer 390, and an inorganic insulating layer 381 is formed as a protective layer over the conductive layer 380 (see FIG. 7B).

Next, a first insulator 382 is formed over the inorganic insulating layer 381, and a fourth insulator 391 is formed over the first insulator 382. Then, the semiconductor integrated circuit 350 is separated from the substrate 300 by using the separation layer 301 (see FIG. 7C).

Here, the first insulator 382 is a structure body in which a fibrous body 383 is impregnated with an organic resin 384. After the first insulator 382 and the fourth insulator 391 are provided over the inorganic insulating layer 381, they are heated and subjected to pressure bonding, so that the semiconductor integrated circuit 350, the first insulator 382, and the fourth insulator 391 are bonded. After that, the semiconductor integrated circuit 350 is separated from the substrate 300 by using the separation layer 301.

Next, a third insulator 388 is provided on an exposed separation surface of the semiconductor integrated circuit 350, and a second insulator 385 is provided so as to be in contact with the third insulator 388. Here, the third insulator 388 is provided on the exposed surface of the semiconductor integrated circuit 350 with an adhesive layer 389 (see FIG. 8A).

The second insulator 385 is a structure body in which a fibrous body 386 is impregnated with an organic resin 387. After the third insulator 388 is provided to in contact with the second insulator 385, it is heated and subjected to pressure bonding, so that the third insulator 388 and the second insulator 385 can be bonded. Note that the second insulator 385 may be bonded after the third insulator 388 is provided on the exposed separation surface of the semiconductor integrated circuit 350, or the second insulator 385 may be bonded before the third insulator 388 is provided on the exposed separation surface of the semiconductor integrated circuit 350.

Figures 8A, 8B:
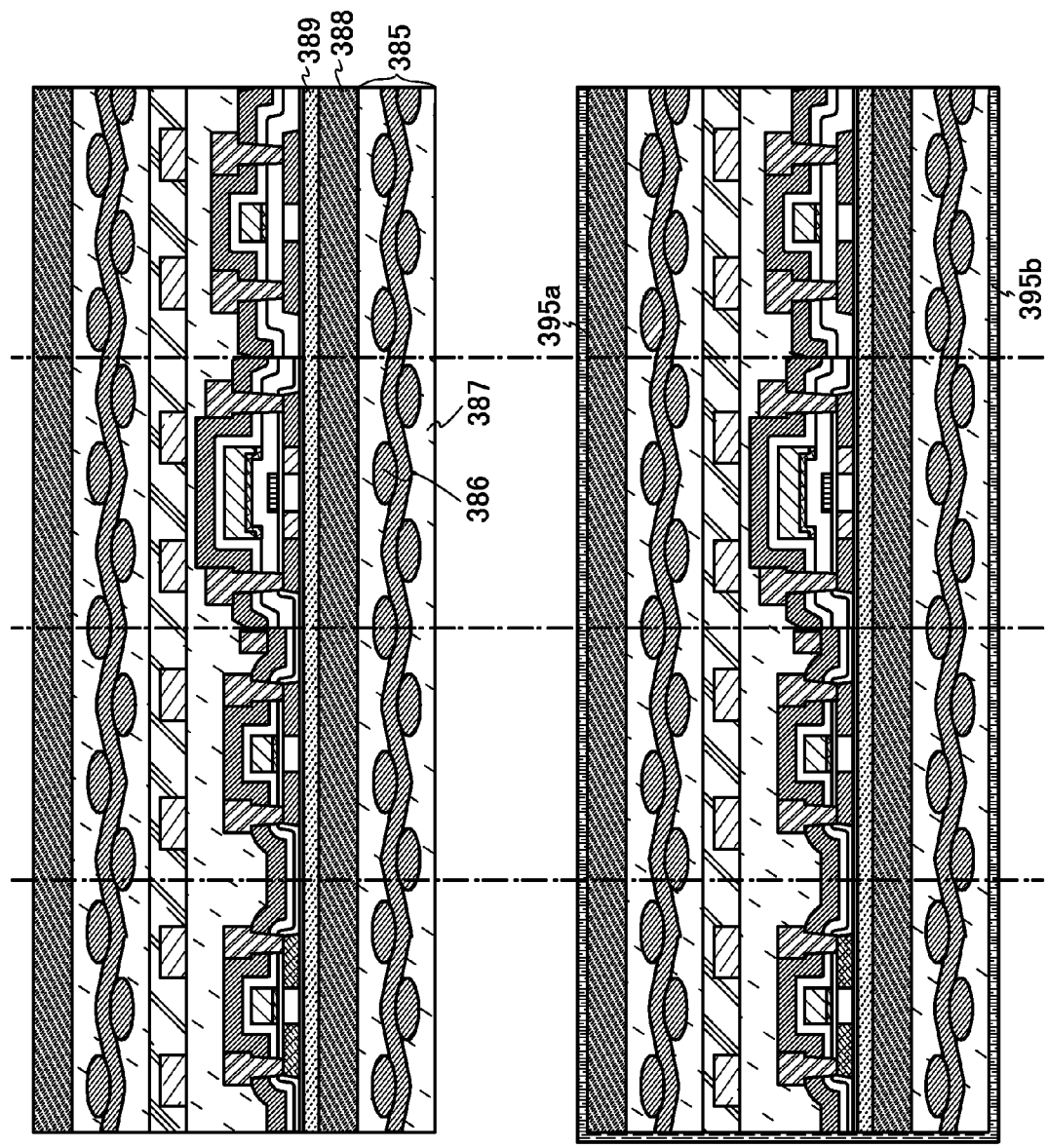
FIGS. 8A and 8B illustrate a method for manufacturing a semiconductor device.

Next, a conductive shield 395a is formed on a surface of the first insulator 382, the conductive shield 395b is formed on a surface of the second insulator 385, and the conductive shield 395a and the conductive shield 395b are electrically connected (see FIG. 8B). In this embodiment, the conductive shields 395a and 395b are each a titanium film formed by a sputtering method to a thickness of 10 nm. Electrical connection between the conductive shield 395a and the conductive shield 395b can be obtained by forming a titanium film on a side surface of the first insulator 382 and a side surface of the second insulator 385 by a sputtering method.

Note that after the conductive shields 395a and 395b are formed on the surfaces of the first insulator 382 and the second insulator 385, respectively, and a conductor is made to penetrate through the first insulator 382 and the second insulator 385, whereby the conductive shield 395a and the conductive shield 395b are electrically connected.

In the practical manufacture process, a plurality of semiconductor integrated circuits which are apart from each other and a plurality of antennas which are apart from each other are sandwiched between the first insulator 382 and the second insulator 385. After the semiconductor integrated circuits are cut off individual semiconductor integrated circuits, the conductive shields 395a and 395b are formed, so that a semiconductor integrated circuit chip can be obtained. There is no particular limitation on a cutoff means as long as the semiconductor integrated circuits can be cut off physically. Cutoff between a plurality of the semiconductor integrated circuits makes a structure in which the conductive layer 380 functioning as an antenna and the semiconductor integrated circuit 350 are sealed with the first insulator 382 and the second insulator 385.

The semiconductor device described in this embodiment can be a flexible semiconductor device by using flexible insulators.

By formation of the conductive shields 395a and 395b, electrostatic breakdown of the semiconductor integrated circuit 350 can be prevented.

Further, the insulators and the conductive shields are provided sandwiching the semiconductor integrated circuit, adverse affect such as damage of the semiconductor integrated circuit and deterioration in characteristics due to external stress or electrostatic discharge can be prevented. Thus, the semiconductor device can be manufactured with a high yield.

By the conductive shield covering the semiconductor integrated circuit, electrostatic breakdown of the semiconductor integrated circuit due to electrostatic discharge can be prevented. With a pair of insulators sandwiching the semiconductor integrated circuit, a highly reliable semiconductor device having high resistance while achieving reduction in thickness and size can be provided. Further, defective shapes and deterioration in characteristics due to external stress or electrostatic discharge are prevented even in a manufacture process, so that a semiconductor device can be manufactured with a high yield.

Embodiment 6

In this embodiment, as examples of the semiconductor device, examples of a microprocessor and a semiconductor device which has an arithmetic function and can transmit and receive data without contact will be described.

Figure 12:
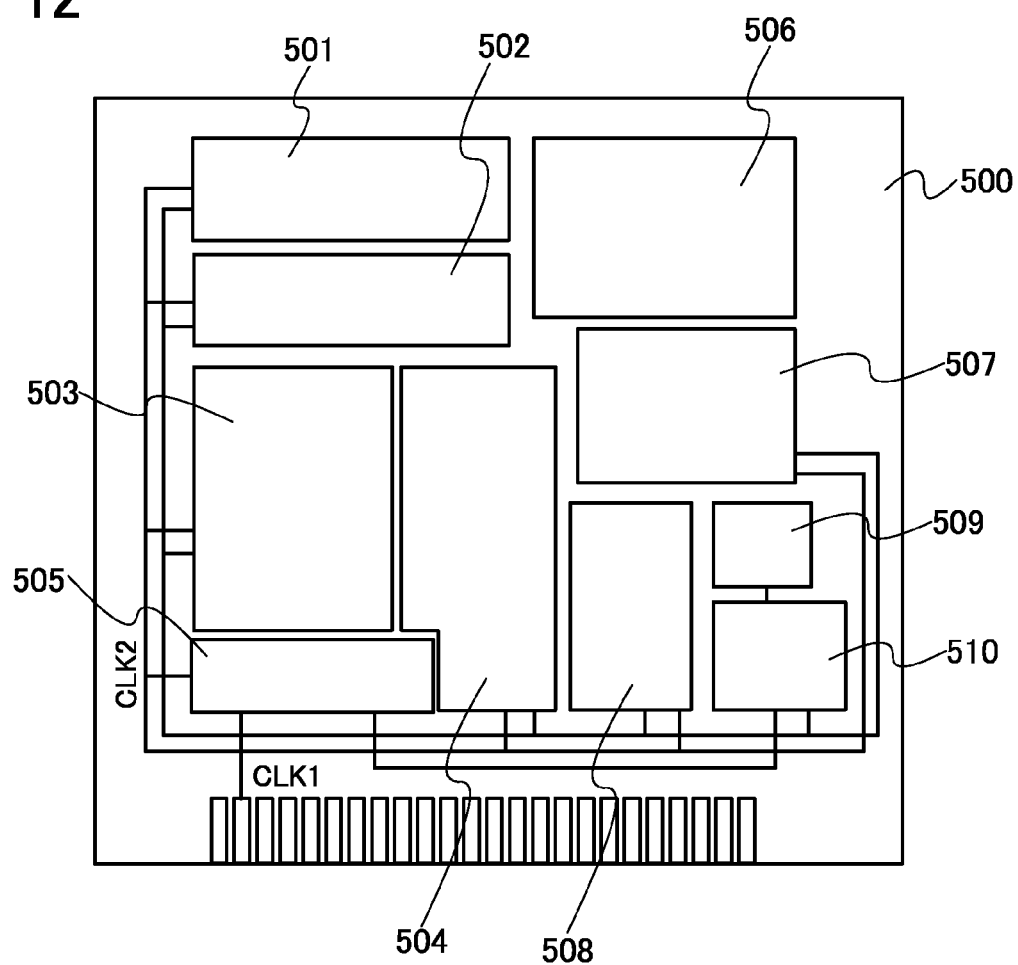
FIG. 12 is a block diagram illustrating a structure of a microprocessor which can be obtained using a semiconductor device.

FIG. 12 illustrates an example of a microprocessor 500 as an example of a semiconductor device. This microprocessor 500 is formed using a semiconductor device formed in accordance with the above embodiments. This microprocessor 500 has an arithmetic logic unit (ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 produces a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 produces signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 illustrated in FIG. 12 is just an example of the simplified structure, and practical microprocessors have a variety of structures depending on usage.

Figure 13:
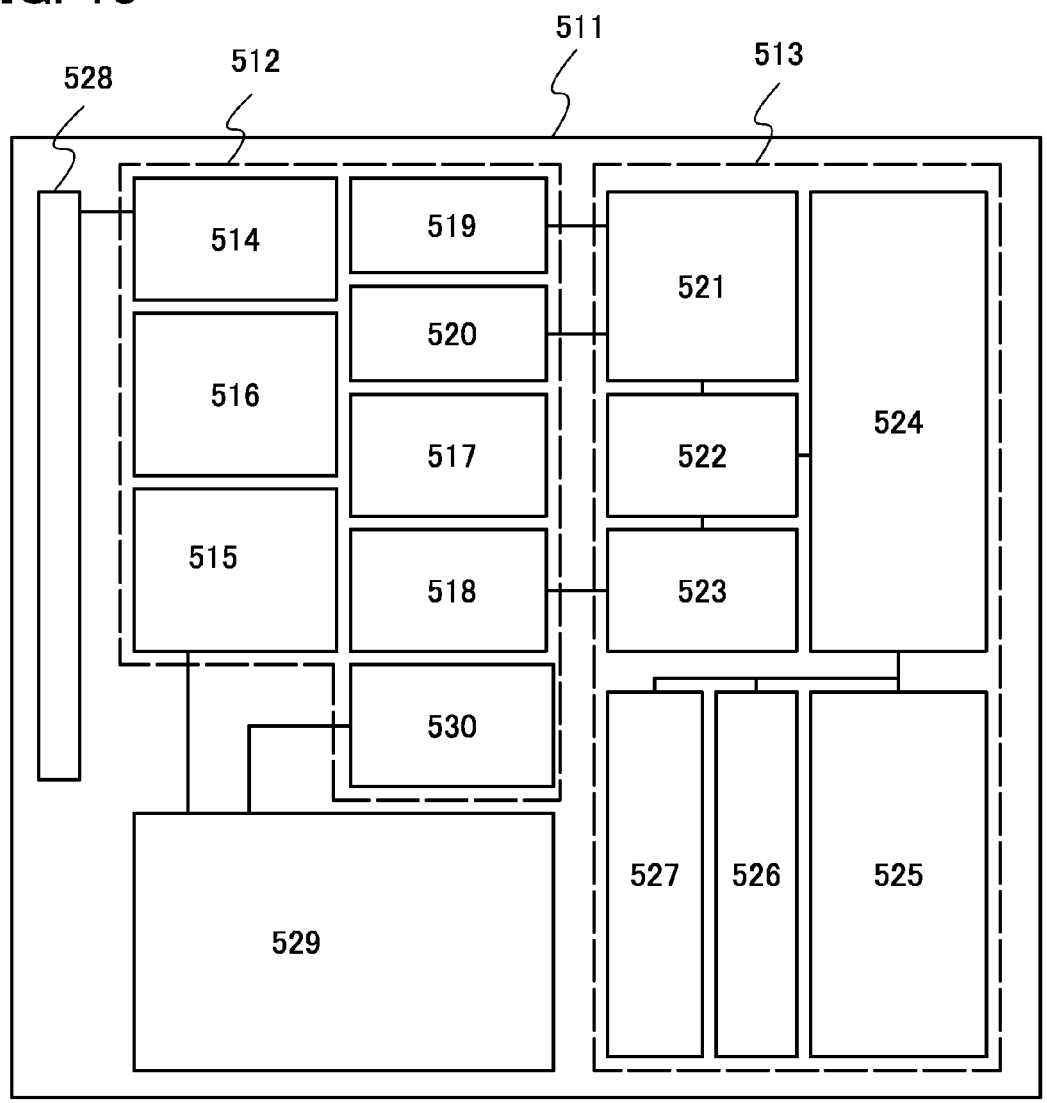
FIG. 13 is a block diagram illustrating a structure of an RFCPU which can be obtained using a semiconductor device.

Next, an example of a semiconductor device which has an arithmetic function and can transmit and receive data without contact is described with reference to FIG. 13. FIG. 13 illustrates an example of a computer (hereinafter also referred to as an RFCPU) which transmits/receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 produces a signal that resets the digital circuit portion 513 to be initialized. For example, a signal which rises with a delay to a rise of the power supply voltage is produced as a reset signal. The oscillator circuit 518 changes the frequency and the duty ratio of a clock signal in accordance with a control signal produced by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 produces a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then cut off into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of producing an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, a method can be employed in which a part of process is conducted in the circuit dedicated to arithmetic and the other part of the arithmetic process is conducted by the central processing unit 525 using a program.

In the microprocessor of this embodiment, by a conductive shield covering a semiconductor integrated circuit, electrostatic breakdown (such as malfunction of the circuit and damage of the semiconductor element) of the semiconductor integrated circuit due to electrostatic discharge is prevented. With a pair of insulators sandwiching the semiconductor integrated circuit, a highly reliable semiconductor device having resistance while achieving reduction in thickness and size can be provided. Further, defective shapes and deterioration in characteristics due to external stress or electrostatic discharge are prevented even in a manufacture process, so that a semiconductor device can be manufactured with a high yield.

Embodiment 7

In this embodiment, an example of usage modes of the semiconductor device described in the above embodiments will be described. Specifically, an application example of a semiconductor device to/from which data can be input/output without contact is described with reference to drawings. The semiconductor device capable of inputting and outputting data without contact is also referred to as an RFID tag, an ID tag, an IC tag, an RF tag, a wireless tag, an electronic tag, or a wireless chip.

An example of a top surface structure of a semiconductor device shown in this embodiment is described with reference to FIG. 21A. A semiconductor device illustrated in FIG. 21A includes a semiconductor integrated circuit chip 400 provided with an antenna (also referred to as an on-chip antenna) and a support substrate 406 provided with an antenna 405 (also referred to as a booster antenna). The semiconductor integrated circuit chip 400 is provided over an insulating layer 410 which is formed over the support substrate 406 and the antenna 405.

As for a semiconductor integrated circuit provided in the semiconductor integrated circuit chip 400, a plurality of elements such as transistors for constituting a memory portion or a logic portion, and the like are provided. In the semiconductor device of this embodiment, not to mention a field-effect transistor, a memory element which uses a semiconductor layer or the like can be employed as a semiconductor element; accordingly, a semiconductor device which can satisfy functions required for various applications can be manufactured and provided.

Figure 20A:
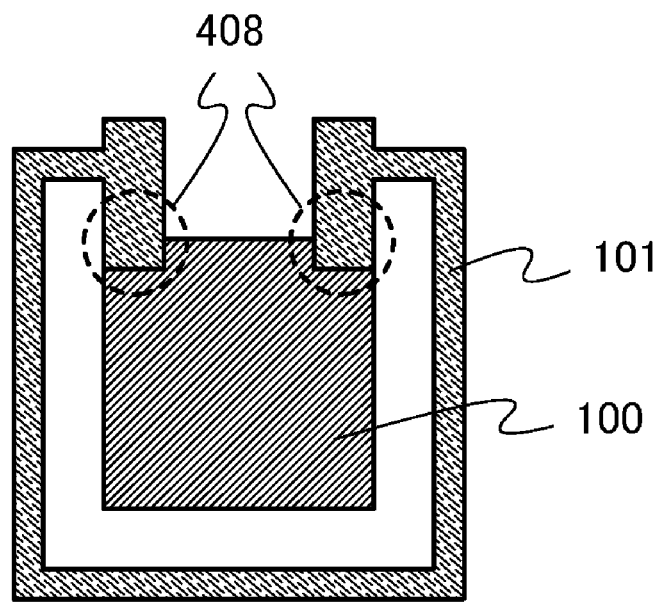
FIGS. 20A and 20B illustrate a semiconductor device.
Figure 21A:
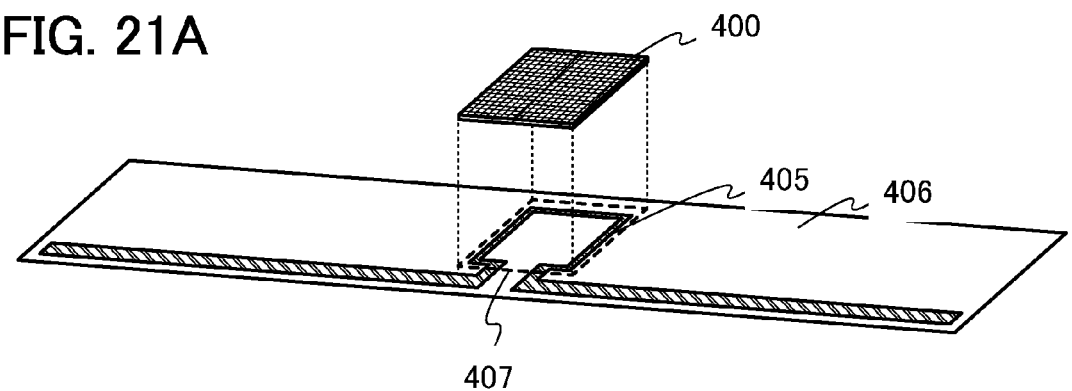
FIGS. 21A to 21C illustrate a semiconductor device.

FIG. 20A is an enlarged view of the antenna and the semiconductor integrated circuit included in the semiconductor integrated circuit chip 400 illustrated in FIG. 21A. In FIG. 20A, the antenna 101 is a rectangular loop antenna whose number of windings is one, but this embodiment is not limited to this structure. The shape of the loop antenna is not limited to a rectangle, and a shape with a curve, e.g., a circular shape, may be formed. In addition, the number of windings is not limited to one. The plurality of windings may be employed; however, in the case where the number of windings of the antenna 101 is one, parasitic capacitance generated between the semiconductor integrated circuit 100 and the antenna 101 can be reduced.

Figure 20B:
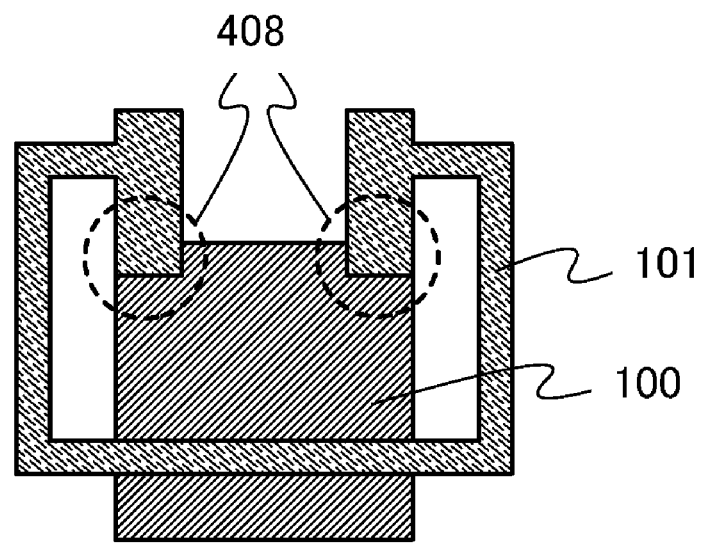

In FIG. 21A and FIG. 20A, the antenna 101 is arranged so as to surround the periphery of the semiconductor integrated circuit 100, and the antenna 101 is arranged in a region different from a region of the semiconductor integrated circuit 100, except portions corresponding to feeding points 408 indicated by a dashed line. However, this embodiment is not limited to this structure. As illustrated in FIG. 20B, the antenna 101 may be arranged so as to partly overlap with the semiconductor integrated circuit 100 in addition to the portions corresponding to the feeding points 408 indicated by the dashed line. Note that in the case where the antenna 101 is arranged in a region different from a region of the semiconductor circuit 100 as illustrated in FIG. 20A, parasitic capacitance generated between the semiconductor integrated circuit 100 and the antenna 101 can be reduced.

In FIG. 21A, the antenna 405 can transmit and receive signals or supply power to/from the antenna 101 by electromagnetic induction mainly in a loop-like shaped portion surrounded by a dashed line 407. Further, the antenna 405 can transmit and receive signals or supply power to/from an interrogator by a radio wave mainly in a region other than the portion surrounded by the dashed line 407. Note that it is preferable that the frequency of a radio wave used as a carrier (carrier wave) between the interrogator and the semiconductor device be approximately from 30 MHz to 5 GHz. For example, a frequency band of 950 MHz, 2.45 GHz, or the like may be employed.

Although the antenna 405 is a rectangular and loop-like shaped antenna whose number of windings is one in the region surrounded by the dashed line 407, this embodiment is not limited to this structure. The loop-like shaped portion does not necessarily have a rectangular shape, and a shape with a curve, e.g., a circular shape, may be formed. In addition, the number of windings is not limited to one, but the plurality of windings may be employed.

To the semiconductor device of this embodiment, an electromagnetic induction method, an electromagnetic coupling method, or a microwave method can be applied. In the case of the microwave method, each shape of the antenna 101 and the antenna 405 may be determined as appropriate depending on the wavelength of an electromagnetic wave to be used.

For example, in the case of employing a microwave method (e.g., a UHF band (860 MHz band to 960 MHz band), a 2.45 GHz band, or the like) as the signal transmission method in the semiconductor device, the length, the shape, and the like of the antenna may be determined as appropriate in consideration of a wavelength of an electromagnetic wave used for signal transmission. For example, the antenna can be formed into a linear shape (e.g., a dipole antenna) or a flat shape (e.g., a patch antenna or an antenna having a ribbon shape). Further, the antenna is not limited to having a linear shape, and the antenna may have a curved shape, a serpentine curved shape, or a shape combining them in consideration of the wavelength of the electromagnetic wave.

Figure 10:
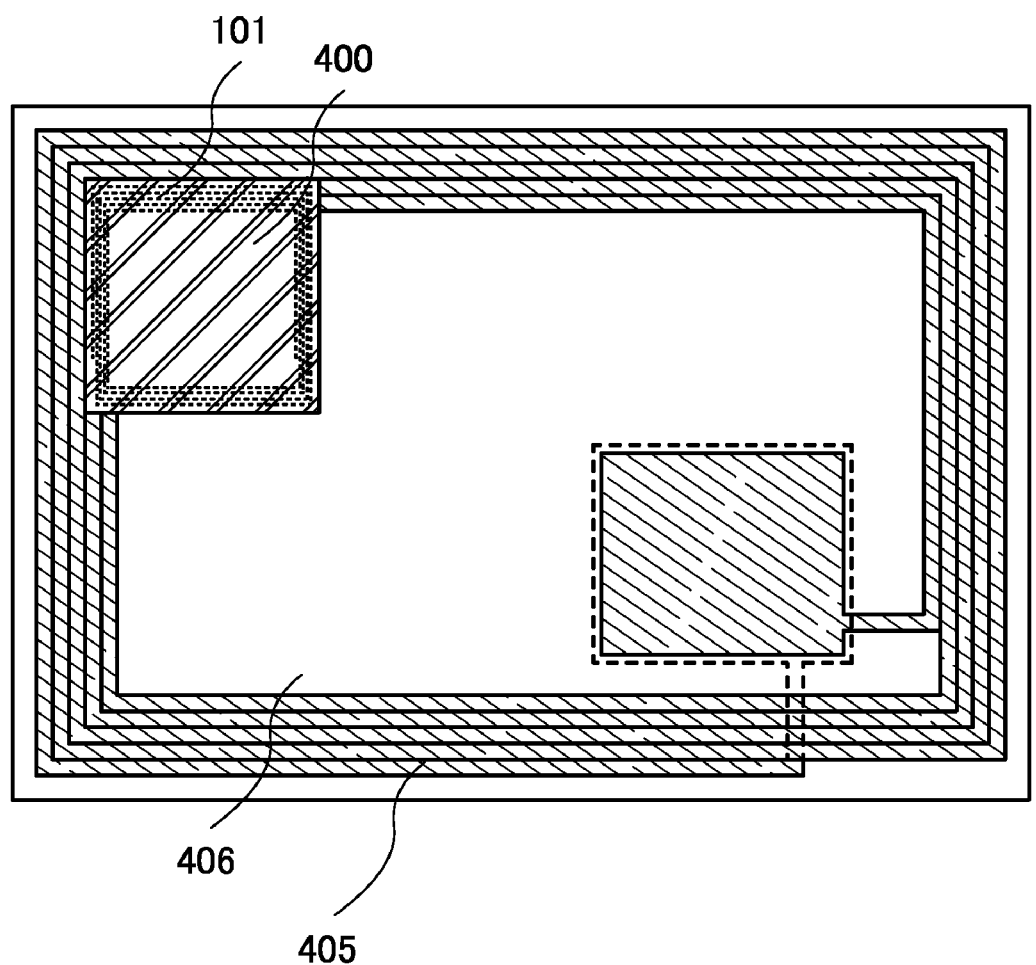
FIG. 10 illustrates a semiconductor device.

FIG. 10 illustrates an example of a semiconductor device provided with the coiled antenna 101 and the coiled antenna 405, to which an electromagnetic induction method or an electromagnetic method is applied.

In FIG. 10, the semiconductor integrated circuit chip 400 provided with the coiled antenna 101 is formed over the support substrate 406 provided with the coiled antenna 405 as a booster antenna. Note that a capacitor is formed by being interposed between the antenna 405 as the booster antenna and the support substrate 406.

Figure 21B:
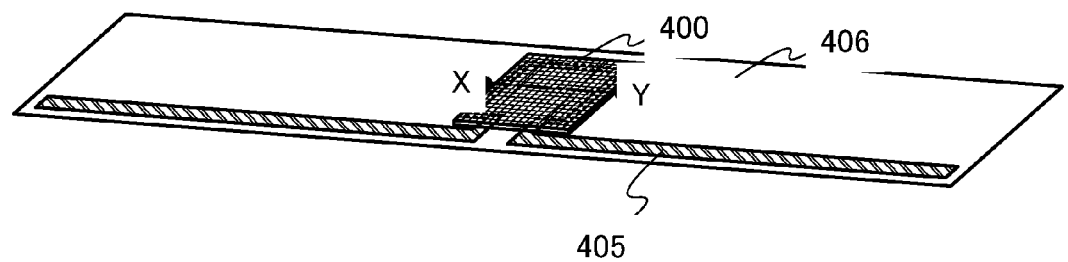

Next, structures of the semiconductor integrated circuit chip 400 and the booster antenna and arrangement thereof are described. FIG. 21B is a perspective view of a semiconductor device in which the semiconductor integrated circuit chip 400 and the antenna 405 provided for the support substrate 406 illustrated in FIG. 21A are stacked. In addition, FIG. 21C is a cross-sectional view along a dashed line X-Y of FIG. 21B.

Figure 21C:
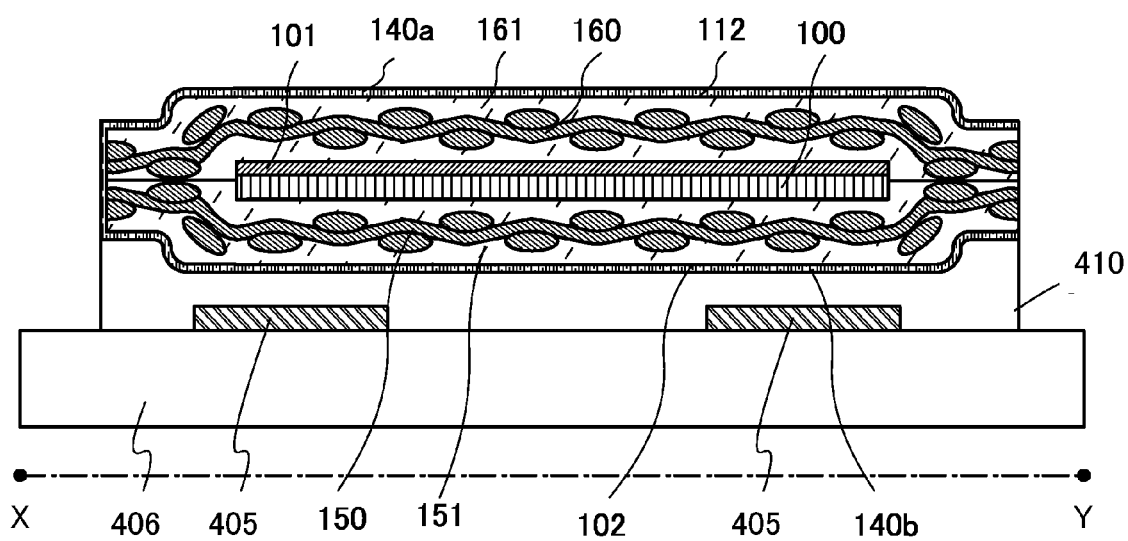

As the semiconductor integrated circuit chip 400 illustrated in FIG. 21C, the semiconductor device described in Embodiments 1 to 6 can be used, and here, a chip form obtained by cutting off the semiconductor device individually is a semiconductor integrated circuit chip. Note that the semiconductor integrated circuit chip illustrated in FIG. 21C is an example of using Embodiment 1, but this embodiment is not limited to this structure and can be applied to another embodiment.

The semiconductor integrated circuit 100 illustrated in FIG. 21C is sandwiched between the first insulator 112 and the second insulator 102 and side surfaces of the semiconductor integrated circuit 100 are sealed. In this embodiment, after the first insulator and the second insulator are bonded to sandwich a plurality of semiconductor integrated circuits, they are cut off into individual semiconductor integrated circuits, so that the semiconductor integrated circuit chip 400 is manufactured. There is no particularly limitation on a cutoff means as long as the semiconductor integrated circuits can be cut off physically, and for example, the semiconductor integrated circuits can be cut off by laser light irradiation.

The semiconductor device of this embodiment includes the conductive shields 140a and 140b which are electrically connected to each other are provided on each outer side (side opposite to the side where the semiconductor integrated circuit is provided) of a pair of insulators sandwiching the antenna and the semiconductor integrated circuit that is electrically connected to the antenna. The conductive shields 140a and 140b transmit electromagnetic waves which are to be transmitted/received by the antenna included in the semiconductor device and shield the semiconductor integrated circuit in the semiconductor device from application of static electricity from the outside.

In FIG. 21C, the semiconductor integrated circuit 100 is arranged at a portion closer to the antenna 405 than the antenna 101 is, but this embodiment is not limited to this structure. The antenna 101 may be arranged to be closer to the antenna 405 than the semiconductor integrated circuit 100 is. The semiconductor integrated circuit 100 and the antenna 101 may be directly bonded to the first insulator 112 and the second insulator 102 or may be bonded to the first insulator 112 and the second insulator 102 with an adhesive layer functioning as an adhesive agent. In the case where conductivity of the conductive shields 140a and 140b is sufficiently low, the conductive shield 140a or the conductive shield 140b may be provided to be in contact with the antenna 405 directly.

Figure 19:
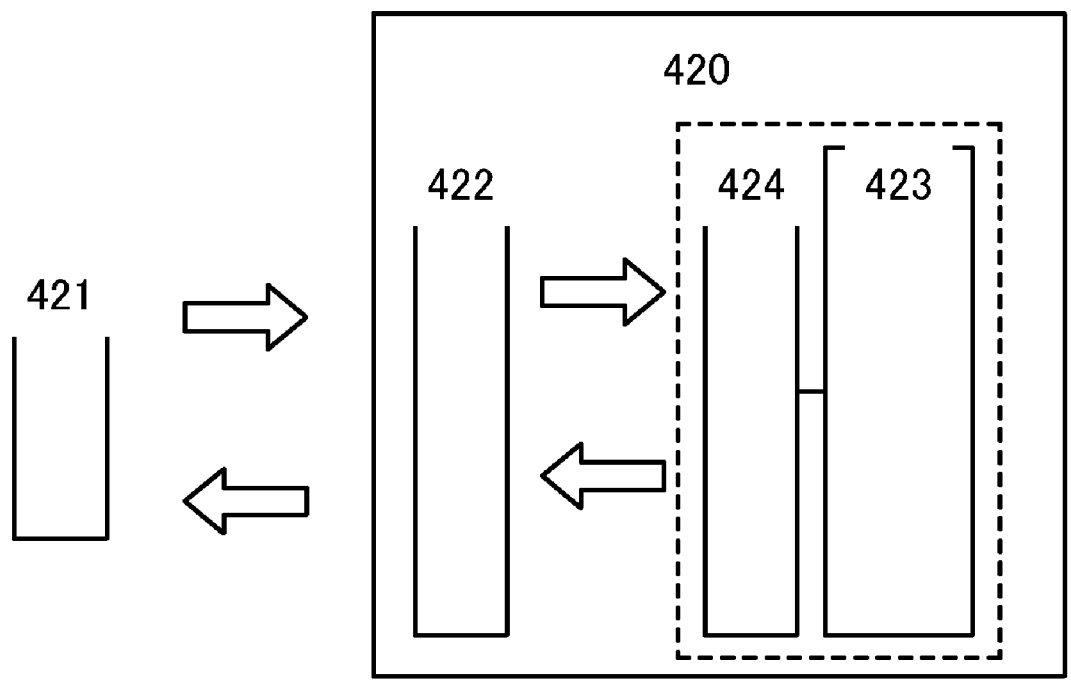
FIG. 19 illustrates a semiconductor device.

Next, operation of the semiconductor device of this embodiment is described. FIG. 19 is an example of a block diagram illustrating a structure of the semiconductor device of this embodiment. A semiconductor device 420 illustrated in FIG. 19 includes an antenna 422 as a booster antenna, a semiconductor integrated circuit 423, and an antenna 424 as an on-chip antenna. When an electromagnetic wave is transmitted from an interrogator 421 and the antenna 422 receives the electromagnetic wave, alternating current is generated in the antenna 422 and a magnetic field is generated in the periphery of the antenna 422. Then, a loop-like shape in the antenna 422 and the antenna 424 in a loop-like shape are coupled electromagnetically, whereby induced electromotive force is generated in the antenna 424. The semiconductor integrated circuit 423 receives a signal or power from the interrogator 421 by using the above induced electromotive force. On the contrary, current is made to flow through the antenna 424 and induced electromotive force is generated in the antenna 422 in accordance with a signal generated in the semiconductor integrated circuit 423, whereby the signal can be transmitted to the interrogator 421 as a reflected wave of a radio wave transmitted from the interrogator 421.

Note that the antenna 422 mainly has a loop-like shaped portion which is coupled electromagnetically with the antenna 424 and a portion which receives a radio wave from the interrogator 421. The shape of the antenna 422 in the portion which mainly receives a radio wave from the interrogator 421 preferably has a shape which is capable of receiving a radio wave. For example, a dipole antenna, a folded dipole antenna, a slot antenna, a meander line antenna, a microstrip antenna, or the like may be used.

Although the structure of the semiconductor integrated circuit having only one antenna is described in FIGS. 21A to 21C, this embodiment is not limited to this structure. Two antennas, that is, an antenna for receiving power and an antenna for receiving a signal may be provided. In the case of two antennas, a frequency of a radio wave for supplying power and a frequency of a radio wave for transmitting a signal can be separately used.

In the semiconductor device of this embodiment, the on-chip antenna is used, and transmission and reception of signals or power between the booster antenna and the on-chip antenna can be performed without contact. Accordingly, unlike the case where an external antenna is connected to the semiconductor integrated circuit, the semiconductor integrated circuit and the antenna is hardly disconnected by force from the outside, and generation of initial defects caused by the connection can be suppressed. In addition, since the booster antenna is used in this embodiment, unlike the case of using only the on-chip antenna, such advantages of the external antenna that the size or shape of the on-chip antenna is hardly restricted by an area of the semiconductor integrated circuit, the frequency band of receivable radio waves is not restricted, and the communication distance can be increased can be obtained.

In the semiconductor device of this embodiment, by a conductive shield covering a semiconductor integrated circuit, electrostatic breakdown (such as malfunction of the circuit and damage of the semiconductor element) of the semiconductor integrated circuit due to electrostatic discharge can be prevented. With a pair of insulators sandwiching the semiconductor integrated circuit, a highly reliable semiconductor device having resistance while achieving reduction in thickness and size can be provided. Further, defective shapes and deterioration in characteristics due to external stress or electrostatic discharge are prevented even in a manufacture process, so that a semiconductor device can be manufactured with a high yield. Therefore, the present invention is effective in the case of a small semiconductor device to/from which data can be input/output without contact as described in this embodiment. Since the semiconductor device of this embodiment has high reliability with respect to force from the outside, environmental conditions under which the semiconductor device can work can be further varied, and thus, versatility of the semiconductor device can be further achieved.

Embodiment 8

In this embodiment, an application example of the above-described semiconductor device capable of inputting/outputting data without contact, which is formed in accordance with the above embodiment, will be described.

Figure 11A:
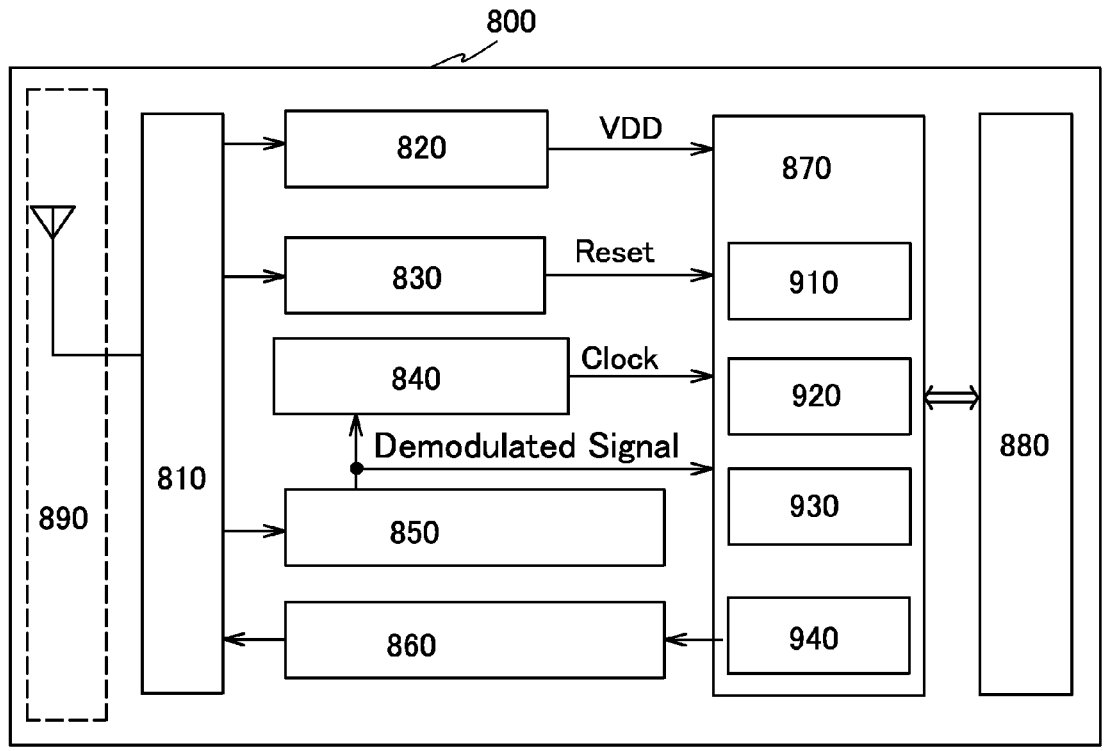
FIGS. 11A to 11C illustrate a semiconductor device.

A semiconductor device 800, which has a function of exchanging data without contact, includes a high frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (see FIG. 11A). The high-frequency circuit 810 receives a signal from the antenna 890 and outputs a signal, which is received from the data modulation circuit 860, with the antenna 890. The power supply circuit 820 generates power supply potential from a received signal. The reset circuit 830 generates a reset signal. The clock generator circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. As the control circuit 870, for example, a code extracting circuit 910, a code judging circuit 920, a CRC judging circuit 930, and an output unit circuit 940 are provided. Note that the code extracting circuit 910 extracts each of a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit in the semiconductor device 800. A signal transmitted to the data demodulation circuit 850 through the high-frequency circuit 810 is demodulated (hereinafter, this signal is referred to as a demodulated signal). Moreover, signals and the demodulated signal passed through the reset circuit 830 and the clock generator circuit 840 through the high-frequency circuit 810 are transmitted to the control circuit 870. The signals transmitted to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulating circuit 860 and then is transmitted by the antenna 890 as a wireless signal. Note that low power supply potential (hereinafter referred to as VSS) is common in the plurality of circuits included in the semiconductor device 800 and VSS can be GND.

In this manner, data in the semiconductor device 800 can be read by transmitting a signal to the semiconductor device 800 from a communication device and by receiving a signal which is transmitted from the semiconductor device 800 by the communication device.

Moreover, in the semiconductor device 800, power supply voltage may be supplied to each circuit by electromagnetic waves without mounting a power supply (battery), or a power supply (battery) may be mounted so that power supply voltage is supplied to each circuit by both electromagnetic waves and the power supply (battery).

Figure 11B:
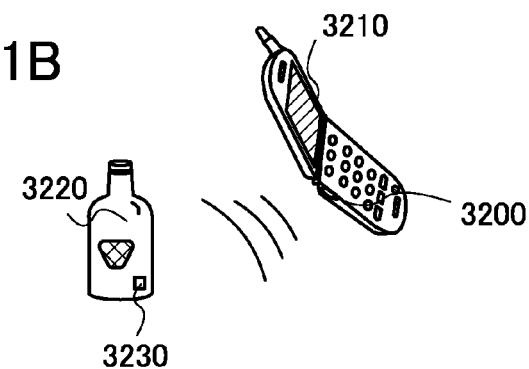
Figure 11C:
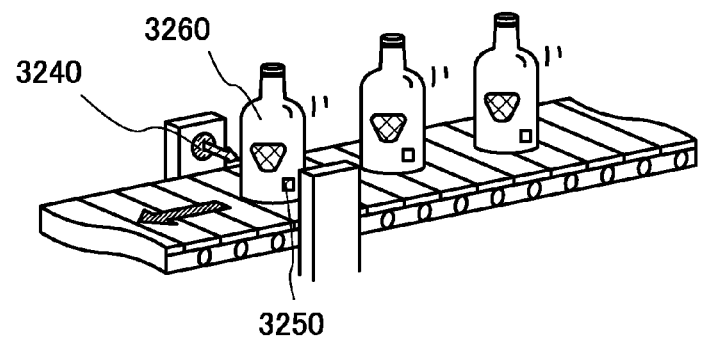

Next, an example of usage of a semiconductor device in which data can be input/output without contact is described. A communication device 3200 is provided for a side surface of a mobile terminal which includes a display portion 3210. A semiconductor device 3230 is provided for a side surface of a product 3220 (see FIG. 11B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 provided for the product 3260 (see FIG. 11C). In this manner, information can be easily obtained, and high functions and high added values are realized by utilizing a semiconductor device for a system.

As described above, a semiconductor device of this embodiment has a very wide range of application and can be used in electronic devices in all kinds of fields.

Embodiment 9

By implementation of the above embodiment, a semiconductor device serving as a chip having a processor circuit (hereinafter also called an RFID tag, an ID tag, an IC tag, an RF tag, a wireless tag, an electronic tag, or a wireless tag) can be formed. The application range of such a semiconductor device is so wide that it may be applied to any object in order that the history thereof is revealed without contact and utilized in production, management, and the like. For example, the semiconductor device may be incorporated in bills, coins, securities, certificates, bearer bonds, containers for packages, books, recording media, personal belongings, vehicles, foods, clothes, healthcare items, livingware, medicals, and electronic apparatuses. These examples will be described with reference to FIGS. 9A to 9G.

The bills and coins are money that circulates in the market, and includes one that can be used in the same way as money in a specific area (cash voucher), a commemorative coin, and the like. The securities include checks, certificates, promissory notes, and the like, and can be provided with a chip 190 including a processor circuit (see FIG. 9A). The certificates refer to driver's licenses, certificates of residence, and the like, and can be provided with a chip 191 including a processor circuit (see FIG. 9B). The personal belongings include bags, a pair of glasses, and the like, and can be provided with a chip 197 including a processor circuit (see FIG. 9C). Bearer bonds refer to stamps, rice coupons, various merchandise coupons, and the like. Packing containers refer to wrapping paper for food containers, plastic bottles, and the like and can be provided with a chip 193 including a processor circuit (see FIG. 9D). The books refer to hardbacks, paperbacks, and the like, and can be provided with a chip 194 including a processor circuit (see FIG. 9E). The recording media refer to DVD software, video tapes, and the like, and can be provided with a chip 195 including a processor circuit (see FIG. 9F).

Figure 9A:
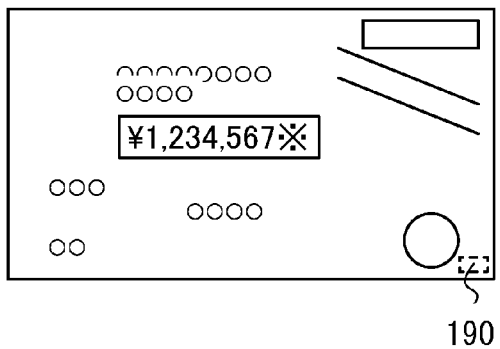
FIGS. 9A to 9G each illustrate an application example of a semiconductor device.
Figure 9B:
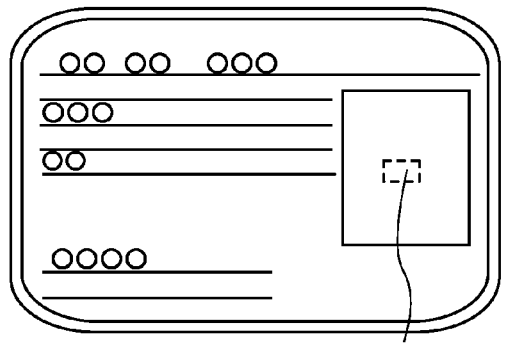
Figure 9C:
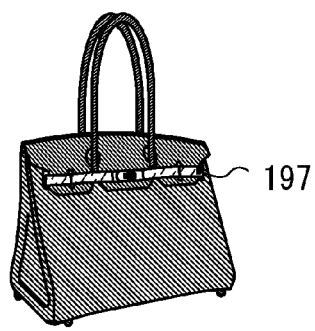
Figure 9D:
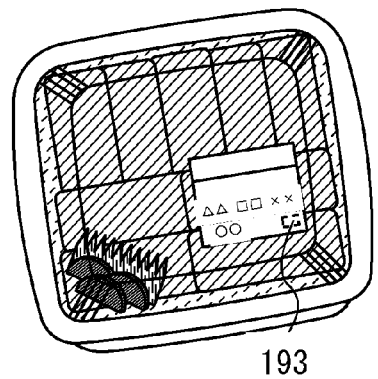
Figure 9E:
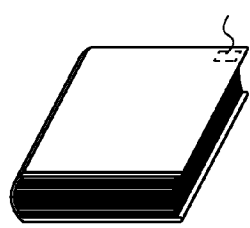
Figure 9F:
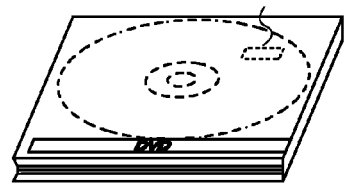
Figure 9G:
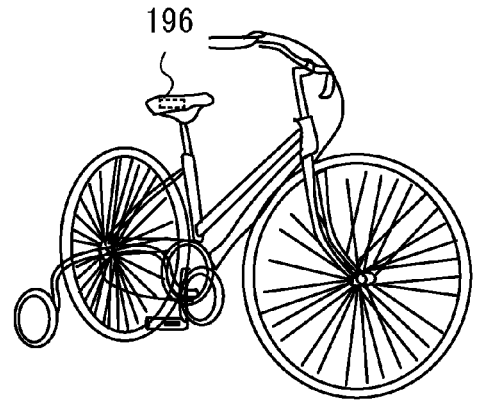

Vehicles refer to wheeled vehicles such as bicycles, ships, and the like, and can be provided with a chip 196 including a processor circuit (see FIG. 9G). The groceries indicate foods, beverages, and the like. The garments indicate clothes, shoes, and the like. The health products indicate a medical apparatus, a health appliance, and the like. The daily commodities indicate furniture, lighting apparatus, and the like. The medicines indicate a drug, an agricultural chemical, and the like. The electronic devices indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Note that this embodiment can be implemented in combination with any of Embodiments 1 to 8 as appropriate.

Embodiment 10

In this embodiment, an example of mounting the semiconductor device described in the above embodiments will be described with reference to FIGS. 18A to 18D.

A semiconductor device of this embodiment can be mounted on a variety of articles as described in Embodiment 9. In this embodiment, an example in which the semiconductor device is mounted on a flexible substrate to form a flexible semiconductor device is described.

Figure 18A:
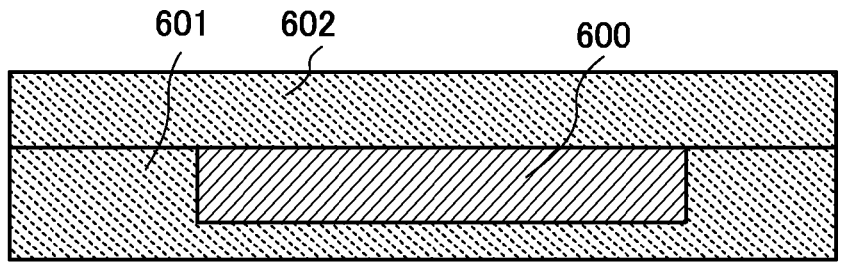
FIGS. 18A to 18D illustrate a semiconductor device.
Figure 18B:
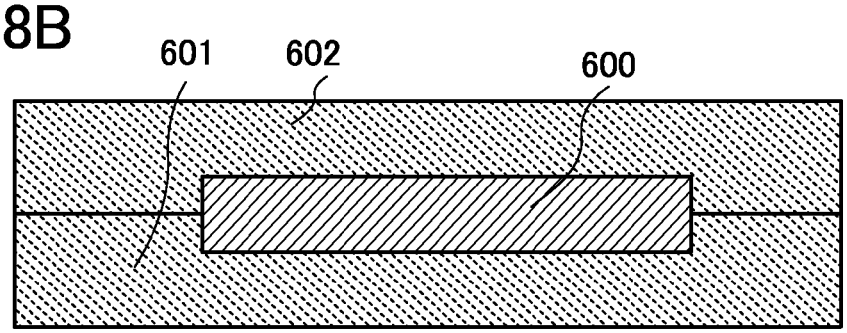
Figure 18C:
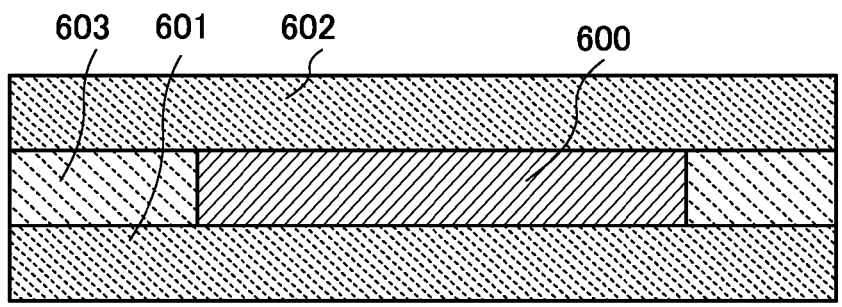
Figure 18D:
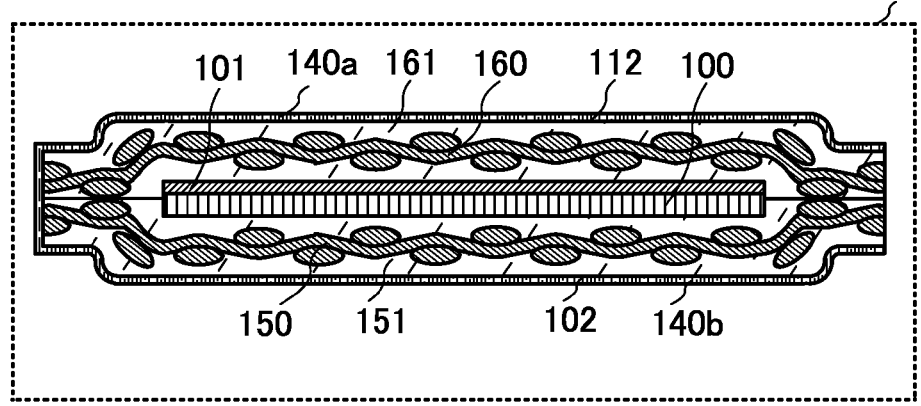

FIGS. 18A to 18C each illustrate an example in which a semiconductor integrated circuit chip is mounted to be embedded into a flexible substrate. As the semiconductor integrated circuit chip, the semiconductor device described in Embodiments 1 to 6 can be used, and here, a chip form obtained by cutting off the semiconductor devices individually is a semiconductor integrated circuit chip. In addition, FIG. 18D illustrates the detail of a semiconductor integrated circuit chip 600. Although the semiconductor integrated circuit chip illustrated in FIG. 18D is an example of using Embodiment 1, this embodiment can be applied to another embodiment and not limited to this structure.

FIG. 18A illustrates the semiconductor integrated circuit chip 600 sandwiched between a flexible substrate 601 and a flexible substrate 602. The semiconductor integrated circuit chip 600 is placed in a recessed portion provided for the flexible substrate 601.

The recessed portion where the semiconductor integrated circuit chip 600 is placed may be provided for one of the flexible substrates or the both flexible substrates. FIG. 18B illustrates an example in which the semiconductor integrated circuit chip 600 is placed in a recessed portion provided for both the flexible substrate 601 and the flexible substrate 602.

Alternatively, the flexible substrate may have a three-layer structure and an opening where the semiconductor integrated circuit chip 600 is placed may be provided in the middle flexible substrate. FIG. 18C illustrates an example in which an opening is provided for a flexible substrate 603, the semiconductor integrated circuit chip 600 is placed in the opening, and the flexible substrate 603 and the semiconductor integrated circuit chip 600 are sandwiched between the flexible substrate 601 and the flexible substrate 602.

In FIGS. 18A to 18C, a flexible substrate may be stacked on outer side of the flexible substrate 601 or the flexible substrate 602.

As for the flexible substrates 601, 602, and 603, a woven fabric which is woven using bundles of fibers (single yarns) (hereinafter, the bundles of fibers are referred to as yarn bundles) for warp yarns and weft yarns, a nonwoven fabric obtained by stacking yarn bundles of plural kinds of fibers in a random manner or in one direction, paper, or the like can be used. Specifically, a layered film of a substrate formed from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; and a film formed from polypropylene, polyester, vinyl, polyvinyl fluoride, vinyl chloride, or the like; paper formed from a fibrous material; an adhesive synthetic resin film (such as an acrylic synthetic resin or an epoxy synthetic resin); or the like can be used. When a substrate or a film is bonded to the object to be treated, an adhesive layer may be used. A condition is selected in accordance with a kind of the substrate or the film, bonding can be performed by heat treatment and/or pressure treatment. The adhesive layer corresponds to a layer having an adhesive agent such as a heat curing resin, an ultraviolet curing resin, an epoxy resin, and a resin additive.

In FIG. 18D, the antenna 101 and the semiconductor integrated circuit 100 are sandwiched between the first insulator 112 and the second insulator 102 and side surfaces of the antenna 101 and the semiconductor integrated circuit 100 are sealed. In this embodiment, the first insulator 112 and the second insulator 102 sandwiches a plurality of semiconductor integrated circuits and a plurality of antennas. After the plurality of semiconductor integrated circuits and the plurality of antennas are cut off into individual antennas 101 and semiconductor integrated circuit 100, the conductive shields 140*a* and 140*b* which are electrically connected to each other are formed on outer side, so that a semiconductor integrated circuit chip is formed. There is no particularly limitation on a cutoff means as long as the semiconductor integrated circuits can be cut off physically, and for example, the semiconductor integrated circuits can be cut off by laser light irradiation. In this case, the antenna 101 and the semiconductor integrated circuit 100 are sealed with the first insulator 112 and the second insulator 102, and protected against electrostatic discharge by the conductive shields 140*a* and 140*b* provided outer sides of the first insulator 112 and the second insulator 102, respectively, corresponding to a top surface and a bottom surface of the semiconductor device.

By the conductive shields covering the semiconductor integrated circuit, electrostatic breakdown of the semiconductor integrated circuit due to electrostatic discharge can be prevented. With a pair of insulators sandwiching the semiconductor integrated circuit, a highly reliable semiconductor device having resistance while achieving reduction in thickness and size can be provided. Further, defective shapes and deterioration in characteristics due to external stress or electrostatic discharge are prevented even in a manufacture process, so that a semiconductor device can be manufactured with a high yield.

As in this embodiment, a recessed portion or an opening is provided for the flexible substrate where the semiconductor device is mounted and the semiconductor integrated circuit chip 600 is placed to be embedded therein, whereby a projected portion caused by provision of the semiconductor integrated circuit chip 600 is not formed. Thus, the surface of the flexible substrate has planarity, and the thickness can be uniform. Accordingly, even if pressure treatment is performed using a roller or the like for bonding the semiconductor integrated circuit chip to the flexible substrate to be mounted, local application of pressure (concentration of pressure) to the semiconductor integrated circuit chip can be prevented. Therefore, damage of the semiconductor integrated circuit chip in the mounting step can be reduced, so that a yield of the semiconductor device is improved. After mounting, a highly reliable semiconductor device having high resistance to external stress can be obtained.

Further, since the semiconductor device can have a planar and smooth surface, it has excellent properties of stacking and transportation when the semiconductor device is stored and is set on a machine. Furthermore, since the semiconductor integrated circuit chip is not seen from the outside (a projected portion reflected by a shape of the semiconductor integrated circuit chip is not generated on the surface), a semiconductor device with high security can be formed.

Example 1

In this example, the semiconductor device described in the above embodiments is manufactured, and a result of reliability evaluation is shown.

As samples, a rectangular layered structure (this example) in which a conductive shield, a fourth insulator, a first insulator, an antenna, a semiconductor integrated circuit, a third insulator, a second insulator, and a conductive shield were sequentially stacked, and a rectangular layered structure (comparative example) in which a fourth insulator, a first insulator, an antenna, a semiconductor integrated circuit, a third insulator, and a second insulator were sequentially stacked, were manufactured.

In the sample, a structure body (with a thickness of 20 μm) in which a fibrous body (a glass fiber) was impregnated with an organic resin (a brominated epoxy resin) was used for each of the first insulator and the second insulator, a titanium film (with a thickness of 10 nm) formed by a sputtering method was used for each of the conductive shields, and an aramid film (with a thickness of 12 μm) was used for each of the third insulator and the fourth insulator. Note that a silicon nitride film was formed as a protective layer over the antenna, and an acrylic resin (with a thickness of 10 μm) was formed as an adhesive layer between the third insulator and the semiconductor integrated circuit. Further, the conductive shield formed on a surface of the fourth insulator and the conductive shield formed on a surface of the second insulator were electrically connected on one side of the rectangle.

A plurality of samples having a structure of this example and a plurality of samples having a structure of the comparative example were manufactured, and ESD measurement (with each five samples) and a bending test (with each five samples) were performed.

The ESD measurement was performed as follows: the samples were put on a stacked body of a glass substrate (with a thickness of 0.5 mm), an aluminum board, and a conductive sheet; voltage was applied to each samples in such a manner that the voltage was applied in the direction of the center portion of the integrated circuit from the side where the conductive shield was formed of each sample, with an ESD tester (simple response evaluation, manufactured by Takaya Corporation); electricity was removed (one minute) after application of ESD; and operation check was performed. Note that operation check was performed in such a condition that a surface on the antenna side with respect to the semiconductor integrated circuit was a top surface and a surface on the side opposite to the antenna, with respect to the semiconductor integrated circuit, was a bottom surface.

Table 1 shows results of the ESD measurement of this example and the comparative example. Note that the ESD measurement was performed on five samples of this example and five samples of the comparative example. In the result of ESD application test, the denominators indicate the number of test samples and the numerators indicate the number of operating samples.

TABLE 1

| | Result of ESD Application Test | | | |
|---|---|---|---|---|
| | ESD Application from Antenna Side | | ESD Application from Semiconductor Integrated Circuit Side | |
| ESD Application Voltage[kV] | Comparative Example | This Example | Comparative Example | This Example |
| 5 kV | 1/5 | 5/5 | 0/5 | 5/5 |
| 10 kV | 0/5 | 5/5 | 0/5 | 5/5 |
| 15 kV | 0/5 | 5/5 | 0/5 | 5/5 |

As the result of the comparative example in which a conductive shield was not provided, in the case where ESD was applied from the antenna side, four samples among five samples became in a non-operating state by application of only 5 kV voltage, and none of the samples operated by sequential application of 10 kV voltage and 15 kV voltage. In the case where ESD was applied from the semiconductor integrated circuit side, none of samples of the comparative example operated in all cases of application of 5 kV voltages, 10 kV voltage, and 15 kV voltage. On the other hand, as the result of this example in which a conductive shield is provided, in both the case where ESD was applied from the antenna side and the case where ESD was applied from the semiconductor integrated circuit side, five samples of this example operated even when 15 kV voltage was applied.

Next, the bending test (with each five samples) was performed on five samples of this example and five samples of the comparative example.

The bending test was performed as follows: five samples having the structure of this example and five samples having the structure of the comparative example were arranged on a tape of polyethylene naphthalate; and the tape of polyethylene naphthalate where 670 g weight was put on one side was made to go back and forth over a metal rod (20 mm in diameter) around which paper was wound.

The results of the bending test of this example and the comparative example are shown in Table 2. Note that five samples of this example and five samples of the comparative example were used in the bending test. The evaluation represents whether or not normal operation was confirmed after test of bending 300 times, and in the evaluation results, the denominators indicate the number of test samples and the numerators indicate the number of operating samples.

TABLE 2

| | Comparative Example | This Example |
|---|---|---|
| Evaluation | 0/5 | 5/5 |

As the results of the samples of the comparative example in which a conductive shield was not provided, all five samples did not show response after going back and forth 300 times. On the other hand, as the results of the samples of this example provided with a conductive shield, all five samples showed response after going back and forth 300 times. According to the above results, it was found that electrostatic breakdown due to electrostatic discharge can be prevented by covering the semiconductor integrated circuit with the conductive shields, and reliability against the bending stress can be improved by the insulators covering the semiconductor integrated circuit. Further, the above results confirmed that a highly reliable semiconductor device having high resistance while achieving reduction in the thickness and size can be provided.

This application is based on Japanese Patent Application serial no. 2008-136066 filed with Japan Patent Office on May 23, 2008, the entire contents of which are hereby incorporated by reference.

EXPLANATION OF REFERENCE

100: semiconductor integrated circuit, 101: antenna, 102: insulator, 103: insulator, 104: adhesive layer, 105: inorganic insulating layer, 110: substrate, 111: separation layer, 112: insulator, 113: insulator, 114: adhesive layer, 140: conductive shield, 150: fibrous body, 151: organic resin, 160: fibrous body, 161: organic resin, 190: chip, 191: chip, 193: chip, 194: chip, 195: chip, 196: chip, 197: chip, 200: substrate, 201: separation layer, 202: insulating film, 206: channel formation region, 207: gate insulating layer, 208: gate electrode layer, 210: transistor, 211: transistor, 212: insulating film, 213: insulating film, 214: insulating layer, 226: channel formation region, 227: gate insulating layer, 228: gate electrode layer, 250: semiconductor integrated circuit, 252: insulator, 254: inorganic insulating layer, 262: insulator, 263: conductive layer, 270: fibrous body, 271: organic resin, 280: fibrous body, 281: organic resin, 300: substrate, 301: separation layer, 302: insulating film, 303: semiconductor layer, 304: semiconductor layer, 305: semiconductor layer, 306: semiconductor layer, 308: gate insulating layer, 309: gate insulating layer, 310: insulating film, 311: charge accumulation layer, 312: gate electrode layer, 313: gate electrode layer, 315: control gate electrode layer, 316: gate electrode layer, 317: gate electrode layer, 318: gate electrode layer, 319: control gate electrode layer, 320: impurity element, 321: mask, 323: channel formation region, 324: impurity element, 325: mask, 329: channel formation region, 330: channel formation region, 331: channel formation region, 350: semiconductor integrated circuit, 360: insulating film, 368: insulating film, 373: thin film transistor, 374: thin film transistor, 375: memory element, 376: thin film transistor, 380: conductive layer, 381: inorganic insulating layer, 382: insulator, 383: fibrous body, 384: organic resin, 385: insulator, 386: fibrous body, 387: organic resin, 388: insulator, 389: adhesive layer, 390: insulating layer, 391: insulator, 395: insulator, 400: semiconductor integrated circuit chip, 405: antenna, 406: support substrate, 407: dashed line, 408: feeding point, 410: insulating layer, 411: capacitor, 420: semiconductor device, 421: interrogator, 422: antenna, 423: semiconductor integrated circuit, 424: antenna, 500: microprocessor, 501: arithmetic logic unit, 502: ALU controller, 503: instruction decoder, 504: interrupt controller, 505: timing controller, 506: register, 507: register controller, 508: bus interface, 509: read only memory, 510: memory interface, 511: RFCPU, 512: analog circuit portion, 513: digital circuit portion, 514: resonance circuit, 515: rectifier circuit, 516: constant voltage circuit, 517: reset circuit, 518: oscillator circuit, 519: demodulation circuit, 520: modulation circuit, 521: RF interface, 522: control register, 523: clock controller, 524: interface, 525: central processing unit, 526: random access memory, 527: read only memory, 528: antenna, 529: capacitor portion, 530: power supply control circuit, 600: semiconductor integrated circuit chip, 601: flexible substrate, 602: flexible substrate, 603: flexible substrate, 800: semiconductor device, 810: high frequency circuit, 820: power supply circuit, 830: reset circuit, 840: clock generator circuit, 850: data demodulation circuit, 860: data modulation circuit, 870: control circuit, 880: memory circuit, 890: antenna, 910: code extracting circuit, 920: code judging circuit, 930: CRC judging circuit, 940: output unit circuit, 122a: p-type impurity region, 140a: conductive shield, 140b: conductive shield, 141a: conductor, 141b: conductor, 203a: impurity region, 204a: drain region, 209a: insulating layer, 210a: wiring layer, 223a: impurity region, 224a: drain region, 229a: insulating layer, 230a: wiring layer, 260a: conductive shield, 260b: conductive shield, 314a: gate electrode layer, 3200: communication device, 3210: display portion, 3220: product, 322a: p-type impurity region, 322b: p-type impurity region, 3230: semiconductor device, 3240: communication device, 3250: semiconductor device, 3260: product, 326a: n-type impurity region, 362a: n-type impurity region, 362b: n-type impurity region, 364a: n-type impurity region, 364b: n-type impurity region, 369a: wiring layer, 369b: wiring layer, 370a: wiring layer, 370b: wiring layer, 371a: wiring layer, 371b: wiring layer, 372a: wiring layer, 372b: wiring layer, 385b: conductive shield, 395a: conductive shield, 395b: conductive shield

The invention claimed is:

1. A semiconductor device comprising:
    a first insulator having a first surface and a second surface opposite to the first surface;
    a second insulator having a third surface and a fourth surface opposite to the third surface so that the first surface and the third surface face each other;
    a semiconductor integrated circuit;
    an antenna,
    wherein the semiconductor integrated circuit and the antenna are provided between the first insulator and the second insulator;
    a first conductive layer provided on the second surface of the first insulator; and
    a second conductive layer provided on the fourth surface of the second insulator,
    wherein the first conductive layer and the second conductive layer are electrically connected,
    wherein the semiconductor integrated circuit and the antenna are electrically connected to each other, and
    wherein the semiconductor integrated circuit and the antenna are electrically isolated from each of the first conductive layer and the second conductive layer.

2. The semiconductor device according to claim 1, wherein any one of the first conductive layer and the second conductive layer has a layered structure.

3. The semiconductor device according to claim 1, wherein the first conductive layer and the second conductive layer each have a metal film.

4. The semiconductor device according to claim 1, wherein the first conductive layer and the second conductive layer each comprises a metal oxide film, a metal nitride film, or a semiconductor film.

5. The semiconductor device according to claim 1, wherein at least one of the first insulator and the second insulator has a thickness of from 5 μm to 50 μm.

6. The semiconductor device according to claim 1, wherein at least one of the first insulator and the second insulator has a structure body in which a fibrous body is impregnated with an organic resin.

7. The semiconductor device according to claim 1, wherein electrical connection between the first conductive layer and the second conductive layer is performed with a conductor penetrating through the first insulator and the second insulator.

8. The semiconductor device according to claim 1, wherein the first conductive layer and the second conductive layer are conductive shields.

9. A semiconductor device comprising:
a first insulator;
a second insulator;
a semiconductor integrated circuit;
an antenna,
wherein the semiconductor integrated circuit and the antenna are provided between the first insulator and the second insulator facing each other;
a first conductive layer provided on one surface of the first insulator; and
a second conductive layer provided on one surface of the second insulator, wherein the first conductive layer and the second conductive layer are electrically connected,
wherein the semiconductor integrated circuit and the antenna are electrically connected to each other, and
wherein the semiconductor integrated circuit and the antenna are electrically isolated from each of the first conductive layer and the second conductive layer.

10. The semiconductor device according to claim 9, wherein any one of the first conductive layer and the second conductive layer has a layered structure.

11. The semiconductor device according to claim 9, wherein the first conductive layer and the second conductive layer each have a metal film.

12. The semiconductor device according to claim 9, wherein the first conductive layer and the second conductive layer each comprises a metal oxide film, a metal nitride film, or a semiconductor film.

13. The semiconductor device according to claim 9, wherein at least one of the first insulator and the second insulator has a thickness of from 5 μm to 50 μm.

14. The semiconductor device according to claim 9, wherein at least one of the first insulator and the second insulator has a structure body in which a fibrous body is impregnated with an organic resin.

15. The semiconductor device according to claim 9, wherein electrical connection between the first conductive layer and the second conductive layer is performed with a conductor penetrating through the first insulator and the second insulator.

16. The semiconductor device according to claim 9, wherein the first conductive layer and the second conductive layer are conductive shields.

17. The semiconductor device according to claim 9,
wherein a part of a side surface of the first insulator is exposed, and
wherein a part of a side surface of the second insulator is exposed.

18. A semiconductor device comprising:
a first insulator;
a second insulator;
a semiconductor integrated circuit;
a first antenna electrically connected to the semiconductor integrated circuit,
wherein the semiconductor integrated circuit and the first antenna are provided between the first insulator and the second insulator;
a first conductive layer provided on one surface of the first insulator;
a second conductive layer provided on one surface of the second insulator; and
a second booster antenna electromagnetically coupled with the first antenna,
wherein the first conductive layer and the second conductive layer are electrically connected,
wherein the semiconductor integrated circuit and the first antenna are electrically isolated from each of the first conductive layer and the second conductive layer.

19. The semiconductor device according to claim 18, wherein any one of the first conductive layer and the second conductive layer has a layered structure.

20. The semiconductor device according to claim 18, wherein the first conductive layer and the second conductive layer each have a metal film.

21. The semiconductor device according to claim 18, wherein the first conductive layer and the second conductive layer each comprises a metal oxide film, a metal nitride film, or a semiconductor film.

22. The semiconductor device according to claim 18, wherein at least one of the first insulator and the second insulator has a thickness of from 5 μm to 50 μm.

23. The semiconductor device according to claim 18, wherein at least one of the first insulator and the second insulator has a structure body in which a fibrous body is impregnated with an organic resin.

24. The semiconductor device according to claim 18, wherein electrical connection between the first conductive layer and the second conductive layer is performed with a conductor penetrating through the first insulator and the second insulator.

25. The semiconductor device according to claim 18, wherein the first conductive layer and the second conductive layer are conductive shields.

26. The semiconductor device according to claim 18, wherein the semiconductor integrated circuit communicates with the outside through the second booster antenna.

27. The semiconductor device according to claim 18,
wherein the second booster antenna is provided over a substrate, and
wherein a lamination of the first insulator, the second insulator, the semiconductor integrated circuit and the first antenna is provided over the second booster antenna.

* * * * *